(12) United States Patent
Sohn et al.

(10) Patent No.: US 12,249,925 B2
(45) Date of Patent: Mar. 11, 2025

(54) POWER SUPPLY AND METHOD OF SUPPLYING POWER TO LOAD

(71) Applicant: EN2CORE TECHNOLOGY, INC., Daejeon (KR)

(72) Inventors: Yeong-Hoon Sohn, Sokcho-si (KR); Se-Hong Park, Busan (KR); Sae-Hoon Uhm, Hwaseong-si (KR)

(73) Assignee: EN2CORE TECHNOLOGY, INC., Daejeon (KR)

( * ) Notice: Subject to any disclaimer, the term of this patent is extended or adjusted under 35 U.S.C. 154(b) by 0 days.

(21) Appl. No.: 18/606,916

(22) Filed: Mar. 15, 2024

(65) Prior Publication Data

US 2024/0223104 A1   Jul. 4, 2024

Related U.S. Application Data

(63) Continuation of application No. 17/572,918, filed on Jan. 11, 2022, which is a continuation of application (Continued)

(30) Foreign Application Priority Data

Jun. 23, 2017   (KR) .......................... 10-2017-0079848

(51) Int. Cl.
*H02M 7/5387*   (2007.01)
*H02M 1/38*   (2007.01)
(Continued)

(52) U.S. Cl.
CPC ............. *H02M 7/537* (2013.01); *H02M 1/38* (2013.01); *H02M 7/5387* (2013.01); *H03H 7/38* (2013.01); *H05H 1/4652* (2021.05)

(58) Field of Classification Search
CPC ...... H02M 1/38; H02M 7/537; H02M 7/5395; H02M 7/539; H02M 7/5387; H02M 7/53871; H05H 1/4652; H03H 7/38
See application file for complete search history.

(56) References Cited

U.S. PATENT DOCUMENTS 4,876,635 A   10/1989   Park et al.
5,902,506 A   5/1999   Scott et al.
(Continued)

FOREIGN PATENT DOCUMENTS

CN   103163764 A   6/2013
EP   2148421 A1   1/2010
(Continued)

OTHER PUBLICATIONS

International Search Report and Written Opinion, International Appl. No. PCT/KR2018/006607, mailed Sep. 21, 2018; ISA/KR, Korean Intellectual Property Office, Daejeon, Korea.
(Continued)

*Primary Examiner* — Gary L Laxton
(74) *Attorney, Agent, or Firm* — Andrew D. Fortney; Central California IP Group, P.C.

(57) ABSTRACT

A power supply includes an inverter configured to convert direct current (DC) power into alternating current (AC) power, an impedance matching circuit configured to supply the AC power to a load, and a controller configured to detect a delay time of an output voltage and an output current output to the impedance matching circuit and the load and to adjust a frequency of the output voltage according to the detected delay time.

10 Claims, 27 Drawing Sheets

Related U.S. Application Data

No. 16/303,492, filed on Nov. 20, 2018, now Pat. No. 11,258,373, which is a continuation of application No. PCT/KR2018/006607, filed on Jun. 11, 2018.

(51) Int. Cl.
*H02M 7/537* (2006.01)
*H03H 7/38* (2006.01)
*H05H 1/46* (2006.01)

(56) References Cited

U.S. PATENT DOCUMENTS

| | | | |
|---|---|---|---|
| 8,674,619 B2 | 3/2014 | Nakamori et al. | |
| 9,008,528 B2 | 4/2015 | Kondo | |
| 9,256,175 B2 | 2/2016 | Kondo | |
| 9,355,822 B2 | 5/2016 | Yamada et al. | |
| 9,595,873 B2 | 3/2017 | Zane et al. | |
| 10,186,908 B2 | 1/2019 | Su | |
| 10,405,378 B2 | 9/2019 | Ignatowski et al. | |
| 2005/0265058 A1* | 12/2005 | Stevanovic | H02M 3/156 363/131 |
| 2009/0045792 A1 | 2/2009 | Sugawara et al. | |
| 2011/0222651 A1 | 9/2011 | Ogawa et al. | |
| 2012/0001569 A1 | 1/2012 | Christoph et al. | |
| 2014/0361690 A1 | 12/2014 | Yamada et al. | |
| 2015/0270787 A1* | 9/2015 | Fujisaki | H02M 3/158 363/41 |
| 2016/0049858 A1 | 2/2016 | Kim et al. | |

FOREIGN PATENT DOCUMENTS

| | | |
|---|---|---|
| EP | 2605616 A2 | 6/2013 |
| JP | 59202715 A | 11/1984 |
| JP | H01318560 A | 12/1989 |
| JP | 02-184267 A | 7/1990 |
| JP | 2676790 B2 | 11/1997 |
| JP | 10-225129 A | 8/1998 |
| JP | 2000-331798 A | 11/2000 |
| JP | 2004327117 A | 11/2004 |
| JP | 2013-135159 A | 7/2013 |
| KR | 20130067224 A | 6/2013 |
| WO | 2013089454 A1 | 6/2013 |

OTHER PUBLICATIONS

Granda-Gutiérrez et al.; "V-I curves and plasma parameters in a high density DC glow discharge generated by a current-source," Journal of Physics: Conference Series 100 (2008) 062019; IOP Publishing; doi:10.1088/1742-6596/100/6/062019.

Office Action, U.S. Appl. No. 16/303,492; June 8, 2021; USPTO, Alexandria, VA.

Notice of Allowance, KR 10-2020-0130168; Oct. 27, 2022; Korean Intellectual Property Office, Daejeon, Korea.

Notice of Allowance, KR 10-2021-0105079; Apr. 12, 2022; Korean Intellectual Property Office, Daejeon, Korea.

Notice of Allowance, KR 10-2022-0063490; Oct. 6, 2023; Korean Intellectual Property Office, Daejeon, Korea.

Office Action, KR Patent Application No. 10-2021-0105079; Aug. 31, 2021; Korean Intellectual Property Office, Daejeon, Korea.

Office Action, KR Patent Application No. 10-2022-0063490; Jan. 9, 2023; Korean Intellectual Property Office, Daejeon, Korea.

Safaee et al.; "A ZVS Pulse Width Modulation Full Bridge Converter with a Low RMS Current Resonant Auxiliary Circuit," IEEE Transactions on Power Electronics, 2015; DOI 10.1109/TPEL.2015. 2473822.

Chien-Ming Wang et al.; "A ZVS-PWM Single-Phase Inverter Using a Simple ZVS-PWM Commutation Cell"; Feb. 2008; pp. 758-766; vol. 55, No. 2; IEEE Transactions on Industrial Electronics.

Office Action, EP Patent Application No. 18820719.5; Apr. 19, 2024; European Patent Office.

\* cited by examiner

Freewheeling Insertion

POWER SUPPLY AND METHOD OF SUPPLYING POWER TO LOAD

CROSS-REFERENCE TO RELATED APPLICATIONS

This application is a continuation of U.S. patent application Ser. No. 17/572,918, filed Jan. 11, 2022, pending, which is a continuation of U.S. patent application Ser. No. 16/303,492, filed Nov. 20, 2018, now U.S. Pat. No. 11,258,373, which is a continuation of and which claims priority to PCT/KR2018/006607 filed on Jun. 11, 2018, expired, which claims priority to Korea Patent Application No. 10-2017-0079848 filed on Jun. 23, 2017, the entireties of which are hereby incorporated by reference.

TECHNICAL FIELD

The present disclosure relates to electronic or electrical devices and, more particularly, to a power supply and a method of supplying power to a load.

BACKGROUND

Various electronic or electrical devices for use in living or industrial sites require a power supply. According to purposes, characteristics or use environment of electronic or electrical device, the electronic or electrical devices may require different types of power supply. Among the electronic or electrical devices, particularly, inductively coupled plasma (ICP) devices require an alternating current (AC) power supply having high power and a high frequency.

A power supply configured to supply power to an inductively coupled plasma device may turn on or off an inverter to controls power supplied to the inductively coupled plasma device. A power supply method of the power supply needs to be controlled to prevent noise or stress generated from the power supply and to efficiently supply power to the inductively coupled plasma device.

Additionally, a power amount of power supplied to the inductively coupled plasma device or a current amount of a current supplied thereto should be controlled to precisely control an operation of the inductively coupled plasma device. Various methods have been studied to control a power amount of power supplied to the inductively coupled plasma device or a current amount of a current supplied thereto. However, most of the methods increase the complexity, volume or price of a power supply. Alternatively, high-frequency switching noise is generated in a power supply or a stress is applied to the power supply to cause malfunction of the power supply. Thus, reliability of the power supply is degraded or life of the power supply is significantly reduced. Accordingly, there is a need for a research into a power supply and a method of supplying power which do not increase complexity and do not cause high-frequency switching noise and a stress.

SUMMARY

Example embodiments of the present disclosure provide a power supply and a method of supplying power which have improved reliability without increasing complexity and causing high-frequency switching noise and stress.

Example embodiments of the present disclosure provide a power supply and a method of supplying power which automatically compensate for a phase difference between an output voltage and an output current.

A power supply according to an example embodiment of the present disclosure includes an inverter configured to convert direct current (DC) power into alternating current (AC) power, an impedance matching circuit configured to supply the AC power to a load, and a controller configured to detect a delay time of an output voltage and an output current output to the impedance matching circuit and the load and to adjust a frequency of the output voltage according to the detected delay time.

In example embodiments, the controller may increase the frequency of the output voltage when the detected delay time is less than a first time.

In example embodiments, the controller may decrease the frequency of the output voltage when the detected delay time is greater than a second time.

In example embodiments, the controller may maintain the frequency of the output voltage when the detected delay time is less than or equal to the second time and greater than or equal to the first time.

In example embodiments, the controller may calculate an average of delay times detected from the output voltage and the output current and may increase the frequency of the output voltage when the average is less than the first time.

In example embodiments, the controller may store k detected delay times (k being a positive integer) and may calculate an average of the k detected delay times.

In example embodiments, the controller may store the subsequent k detected delay times and may calculate the average of the k detected delay times after calculating the average and adjusting the frequency of the output voltage depending on the calculated average.

In example embodiments, the controller may adjust the k.

In example embodiments, the controller may increase the frequency of the output voltage when, among delay times detected from the output voltage and the output current, delay times less than a first time are dominant.

In example embodiments, the controller may determine that the delay times less than the first time are dominant, when the number of the delay times less than the first time is greater than or equal to one-third of the number of the detected delay times.

In example embodiments, the controller may store k detected delay times (k being a positive integer) and may determine dominant delay times among the stored k detected times.

In example embodiments, the controller may immediately increase the frequency of the output voltage without determination of the dominant delay times when n continuous delay times (n being a positive integer less than k) are less than the first time.

In example embodiments, the power supply may further include a transformer inductively coupled to a wiring between the inverter and the load and configured to output a first signal having a current of the same phase as an output current provided to the load and a comparator configured to output a second signal indicating the phase of the output current from an output signal of the transformer and to output the second signal to the controller.

In example embodiments, the inverter may include a first transistor and a first diode coupled in parallel between a power supply node and a first output node, a second transistor and a second diode coupled in parallel between the first output node and a ground node, a third transistor and a third diode coupled in parallel between the ground node and a second output node, and a fourth transistor and a fourth diode coupled in parallel between the power supply node and the second output node. The first output node and the second output node may be connected to the impedance matching circuit, and the controller may control respective voltages of gates of the first to fourth transistors.

In example embodiments, the controller may adjust the frequency of the output voltage depending on a phase difference between the second signal and a switching signal provided to the first transistor.

In example embodiments, the inverter may further include an inductor coupled between the first output node and the second output node.

In example embodiments, the controller may be further configured to adjust dispositions of a powering period, in which the inverter outputs the AC power, and a freewheeling period, in which the inverter does not output the AC power, such that the inverter adjusts an amount of power per unit time supplied to the load through the impedance matching circuit.

In example embodiments, the controller may adjust the frequency of the output voltage according to the same characteristics when the delay times continuously exhibit the same characteristics.

A method of supplying power to a load includes detecting a delay time of an output voltage and an output current output to the load and adjusting a frequency of the output voltage depending on the detected delay time.

In example embodiments, the detecting and the adjusting may be repeated until the delay time falls within a predetermined range.

In example embodiments, the delay time may include an average of delay times.

In example embodiments, the adjusting may include storing delay times, counting the number of delay times less than a first time, among the stored delay times, as a first count, counting the number of delay times greater than a second time, among the stored delay times, as a second count, counting the number of delay times greater than or equal to the first time and less than or equal to the second time as a third count, and adjusting the frequency of the output voltage depending a dominant count among the first to third counts.

In example embodiment, the adjusting may include adjusting the frequency of the output voltage according to the same characteristics when delay times continuously exhibit the same characteristics.

In example embodiments, the method may further include receiving a target power amount, comparing an amount of power supplied to the load with the target power amount, adjusting a powering period, in which alternating current (AC) power is supplied to the load, and a freewheeling period, in which the AC power is not supplied to the load, such that the target power amount and the amount of power per unit time become equal to each other, depending on a comparing result, and supplying power to the load according to the adjusted powering and freewheeling periods.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
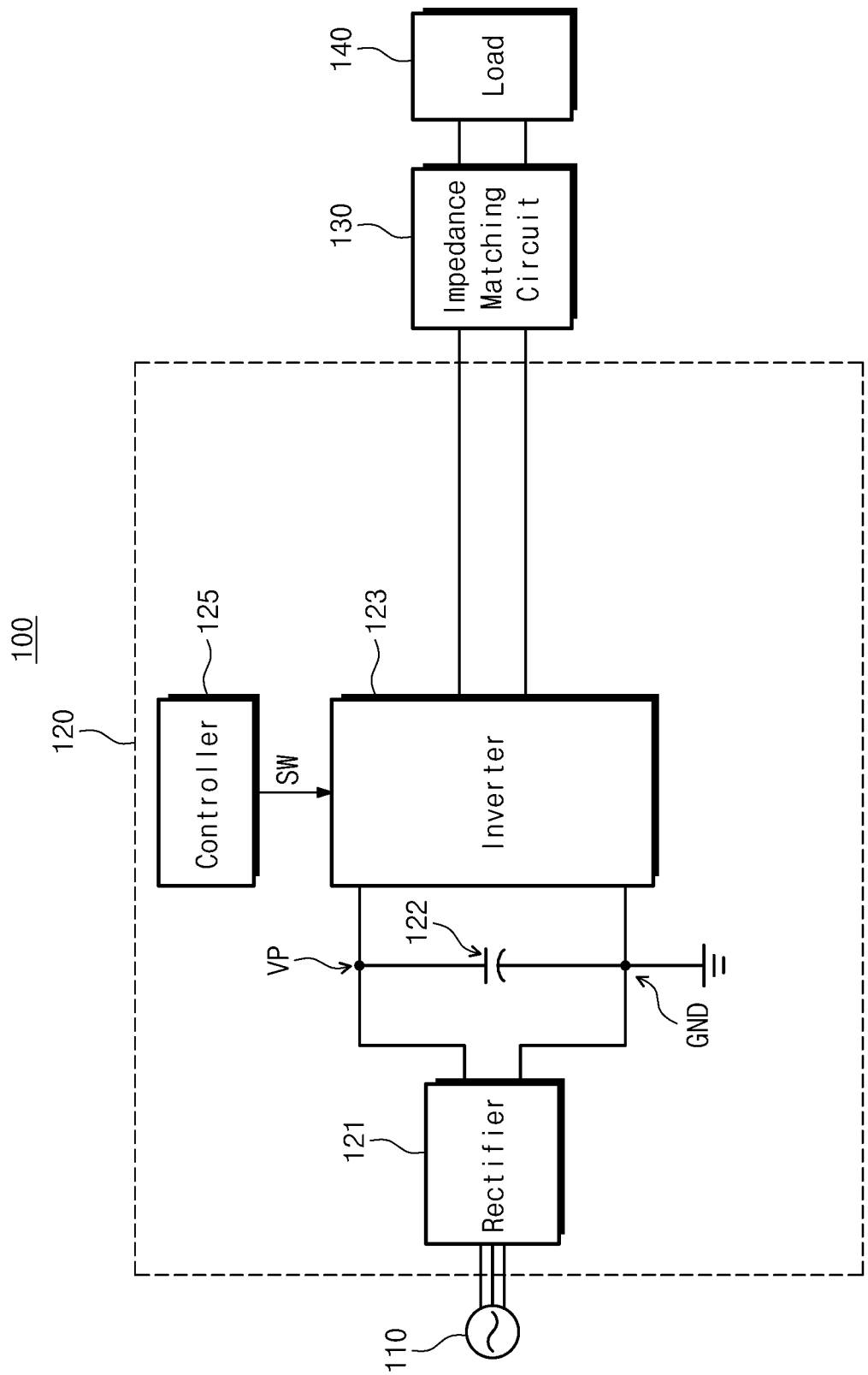
FIG. 1 is a block diagram of a power supply system according to an example embodiment of the present disclosure.

Example embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Reference numerals are indicated in detail in example embodiments of the present disclosure, and their examples are represented in reference drawings. In every possible case, like reference numerals are used for referring to the same or similar elements in the description and drawings.

FIG. 1 is a block diagram of a power supply system 100 according to an example embodiment of the present disclosure. Referring to FIG. 1, the power supply system 100 includes AC power 110, a power supply 120, and a load 140. The AC power 110 may be a 60 Hz power used in a house or an industrial field. The load 140 may be an electrical or electronic device used in a house or an industrial field. For example, the load 140 may be an inductively coupled plasma (ICP) device.

The power supply 120 may convert first AC power into second AC power and may supply the second AC power to the load 140. For example, the second AC power may have a frequency of several hundreds of kilohertz (kHz) to tens of megahertz (MHz) and may have power of several kilowatts (kW) or more. The power supply 120 may include a rectifier 121, a capacitor 122, an inverter 123, an impedance matching circuit 130, and a controller 125.

The rectifier 121 may convert an output of the AC power 110 into DC power. For example, the rectifier 121 may supply DC power between a ground node GND and a power supply node VP. The capacitor 122 may be connected between the power supply node VP and the ground node GND. The capacitor 122 may discharge an AC component transmitted to the power supply node VP to the ground node GND.

The inverter 123 may receive the DC power from the power supply node VP and the ground node GND. The inverter 123 may receive switching signals SW from the controller 125. The inverter 123 may convert the DC power into second AC power in response to the switching signals SW. The second AC power may be supplied to the load 140 through the impedance matching circuit 130. The impedance matching circuit 130 may provide matching for an impedance of the load 140.

The controller 125 may transmit the switching signals SW to the inverter 123. The controller 125 may control the switching signals SW such that the inverter 123 converts the DC power to the second AC power. The controller 125 may also control the switching signals SW to regulate the amount of power supplied from the inverter 123 to the load 140. For example, the controller 125 may control the switching signals SW such that the inverter 123 supplies power through powering and freewheeling periods according to an example embodiment. The powering and the freewheeling periods will be described below in more detail.

Figure 2:
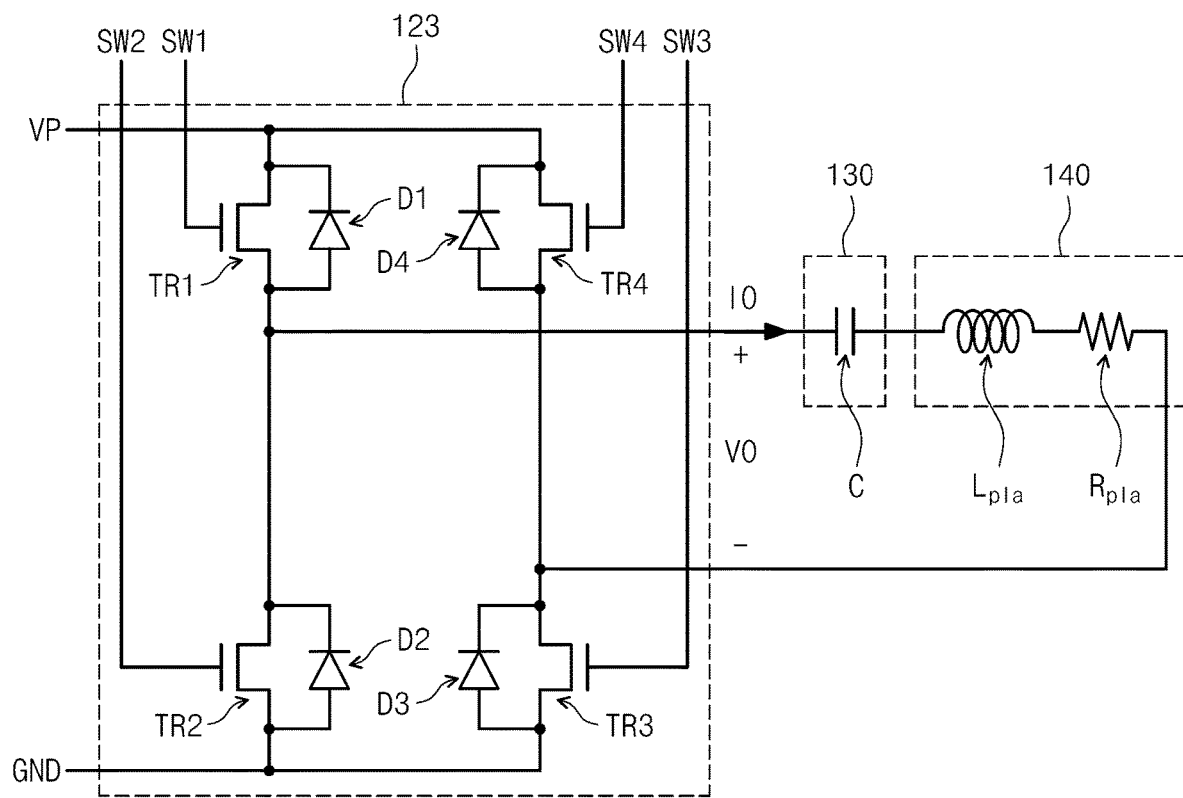
FIG. 2 is a detailed circuit diagram of an inverter, an impedance matching circuit, and a load according to an example embodiment of the present disclosure.

FIG. 2 is a detailed circuit diagram of an inverter 123, an impedance matching circuit 130, and a load 140 according to an example embodiment of the present disclosure. Referring to FIGS. 1 and 2, the inverter 123 may include first to fourth transistors TR1 to TR4 and first to fourth diodes D1 to D4.

The first and second transistors TR1 and TR2 may be coupled in series between a power supply node VP and a ground node GND. The first diode D1 may be connected in parallel to the first transistor TR1, and the second diode D2 may be connected in parallel to the second transistor TR2. The third and fourth transistors TR3 and TR4 may be coupled in series between the ground node GND and the power supply node VP. The third diode D3 may be connected in parallel to the third transistor TR3, and the fourth diode D4 may be connected in parallel to the fourth transistor TR4. As an example, the first to fourth diodes D1 to D4 may be body diodes or Schottky diodes.

First to fourth switching signals SW1 to SW4 may be transmitted to gates of the first to fourth transistors TR1 to TR4, respectively. That is, the first to fourth transistors TR1 to TR4 may operate in response to the first to fourth switching signals SW1 to SW4, respectively. The first to fourth switching signals SW1 to SW4 may correspond to the switching signals SW shown in FIG. 1.

A node between the first and second transistors TR1 and TR2 and a node between the third and fourth transistors TR3 and TR4 may be output nodes. The output nodes may transmit an output voltage VO to the impedance matching circuit 130 and the load 140. The output nodes may transmit an output current IO to the impedance matching circuit 130 and the load 140.

As an example, the impedance matching circuit 130 may include a capacitor C. However, an internal configuration of the impedance matching circuit 130 is not limited to a single capacitor. As an example, the load 140 may be an inductively coupled plasma (ICP) device. The load 140 may be modeled as an inductor Lpla and a resistor Rpla. The capacitor C, the inductor Lpla, and the resistor Rpla may be coupled in series between the output nodes of the inverter 123.

Figure 3:
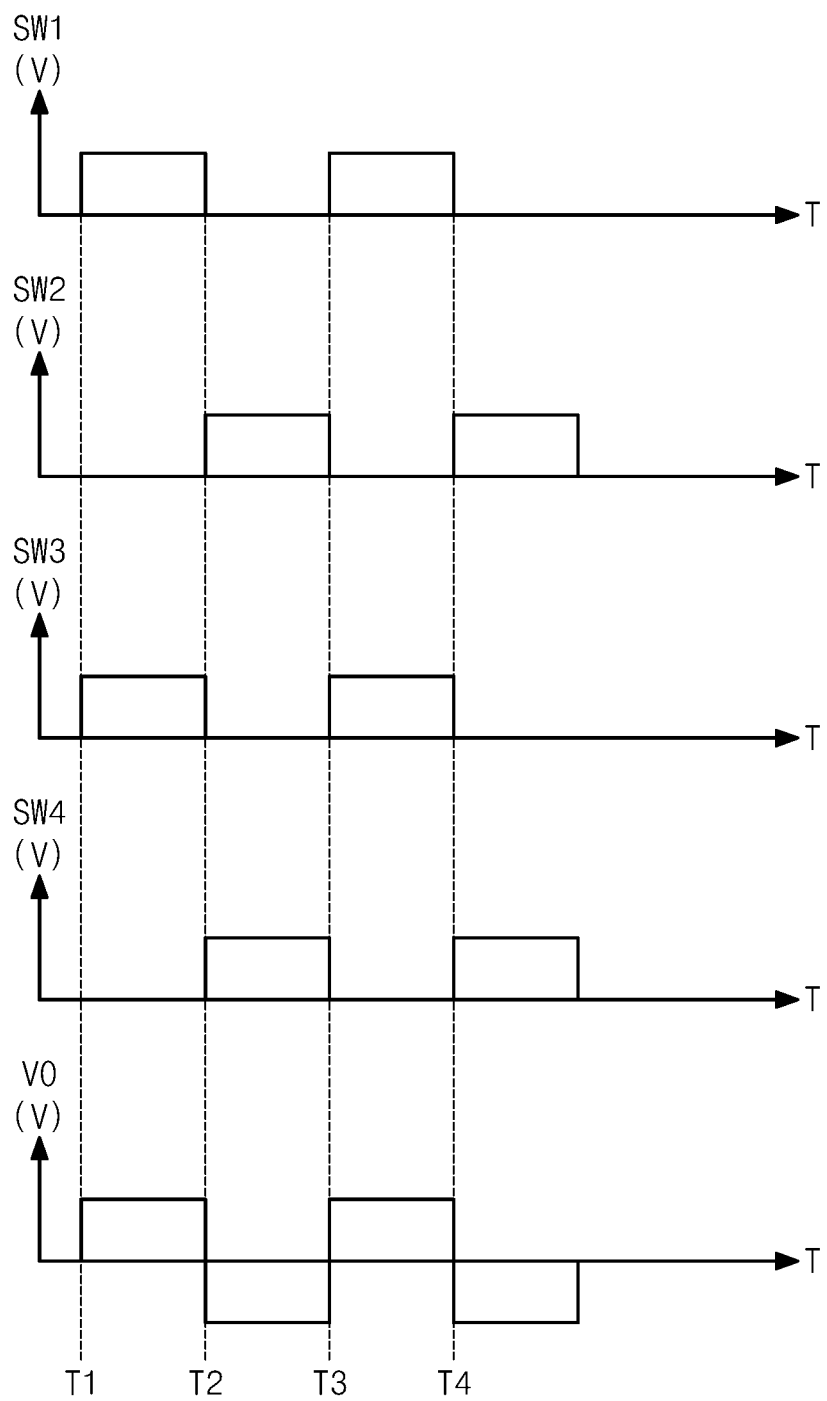
FIG. 3 illustrates an example in which a controller controls first to fourth switching signals.

FIG. 3 illustrates an example in which a controller 125 controls first to fourth switching signals SW1 to SW4.

In FIG. 3, horizontal axes indicate time T and vertical axes indicate first to fourth switching signals SW 1 to SW 4 and an output voltage. A unit of the vertical axes may be a voltage V. Referring to FIGS. 1 to 3, the first and third switching signals SW1 and SW3 are controlled in a single pair, and the second and fourth switching signals SW2 and SW4 may be controlled in a single pair When the first switching signal SW1 has a high level, the third switching signal SW3 may also have a high level. When the first switching signal SW1 has a low level, the third switching signal SW3 may also have a low level. Similarly, when the second switching signal SW2 has a high level, the fourth switching signal SW4 may also have a high level. When the second switching signal SW2 has a low level, the fourth switching signal SW4 may also have a low level.

The first and third switching signals SW1 and SW3 and the second and fourth switching signals SW2 and SW4 may be complementarily controlled. For example, when the first and third switching signals SW1 and SW3 have a high level, the second and fourth switching signals SW2 and SW4 may have a low level. When the first and third switching signals SW1 and SW3 have a low level, the second and fourth switching signals SW2 and SW4 may have a high level.

When a specific switching signal has a high level, a transistor to which the specific switching signal is transmitted may be turned on. When a specific switching signal has a low level, a transistor to which the specific switching signal is transmitted may be turned off.

When the first and third transistors TR1 and TR3 are turned on and the second and fourth transistors TR2 and TR4 are turned off, the first transistor TR1 may transmit a voltage at a power supply node VP and the third transistor TR3 may transmit a voltage at a ground node GND. Thus, the output voltage VO may have a positive value while the output current IO may have a positive value. That is, the output current IO may flow in a direction shown in FIG. 2.

When the first and third transistors TR1 and TR3 are turned off and the second and fourth transistors TR2 and TR4 are turned on, the second transistor TR2 may transmit a voltage at the ground node GND and the fourth transistor TR4 may transmit a voltage at the power supply node VP. Thus, the output voltage VO may have a negative value while the output current IO may have a negative value. That is, the output current may flow in a reverse direction of the direction shown in FIG. 2.

Figure 4:
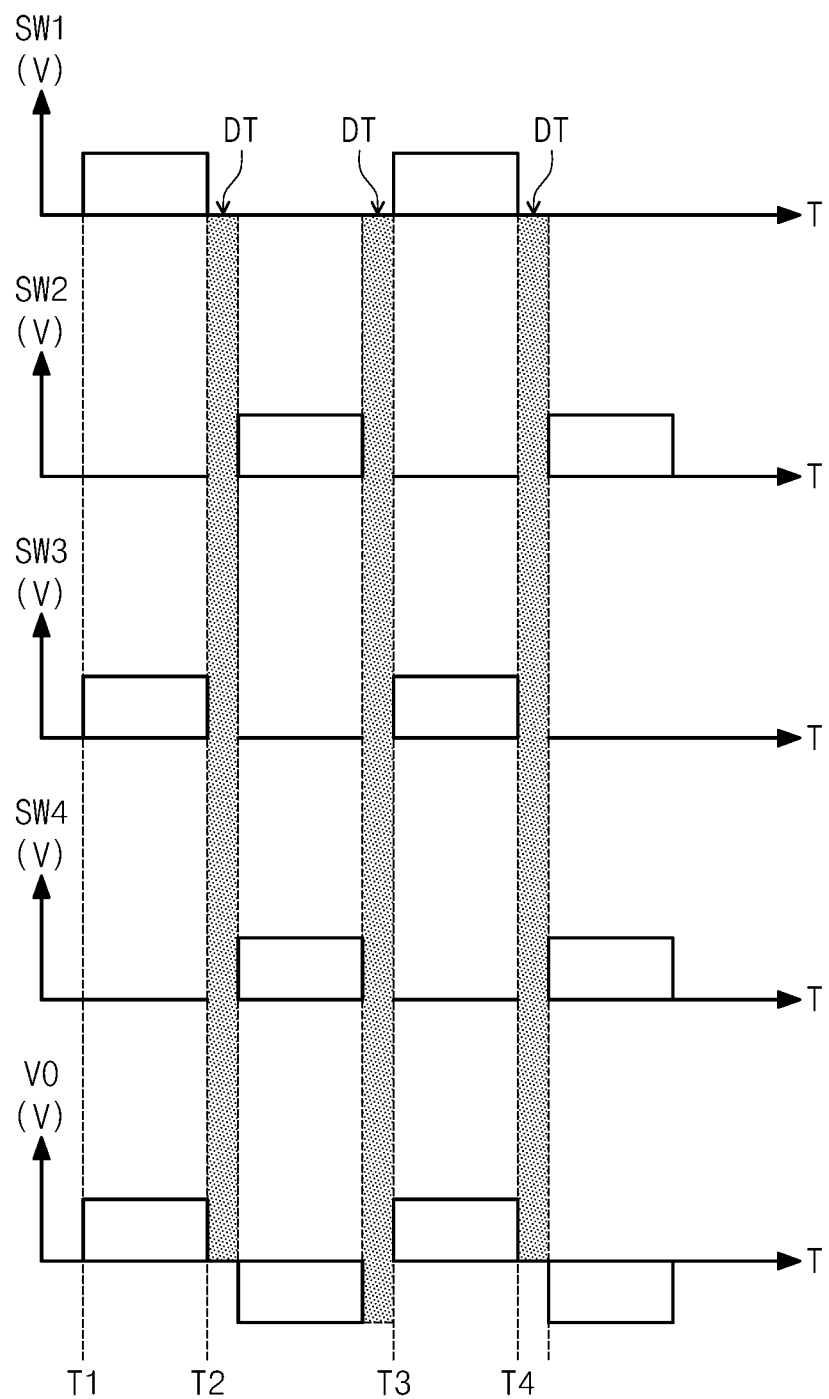
FIG. 4 illustrates an example in which dead time is added to first to fourth switching signals.

FIG. 4 illustrates an example in which dead time DT is added to first to fourth switching signals SW1 to SW4. In FIG. 4, horizontal axes indicate time T and vertical axes indicate first to fourth switching signals SW1 to SW4 and an output voltage VO. A unit of the vertical axes may be a voltage V.

As compared to FIG. 3, there is a dead time DT between a time point at which the first and third switching signals SW1 and SW3 transition from a high level to a low level and a time point at which the second and fourth switching signals SW2 and SW4 transition from a low level to a high level. Similarly, there is a dead time DT between a time point at which the first and third switching signals SW1 and SW3 transition from a low level to a high level and a time point at which the second and fourth switching signals SW2 and SW4 transition from a high level to a low level.

For the dead time DT, the first to fourth switching signals SW1 to SW4 all have low levels. That is, the first to fourth transistors TR1 to TR4 are turned off. The dead time DT may prevent the power supply node VP and the ground node GND from being short-circuited. For the dead time DT, the output voltage VO may have a level determined depending on a voltage and a current before the dead time DT and the operation timing of the first to fourth transistors TR1 to TR4.

Hereinafter, to avoid the complexity of description, first to fourth switching signals SW1 to SW4 and an output voltage VO will be shown while omitting dead time DT unless the dead time DT is necessary for explanation of the present inventive concepts. Even when the dead time DT is not explicitly shown or mentioned, it is not interpreted that the dead time DT is not intended to exist.

Figure 5:
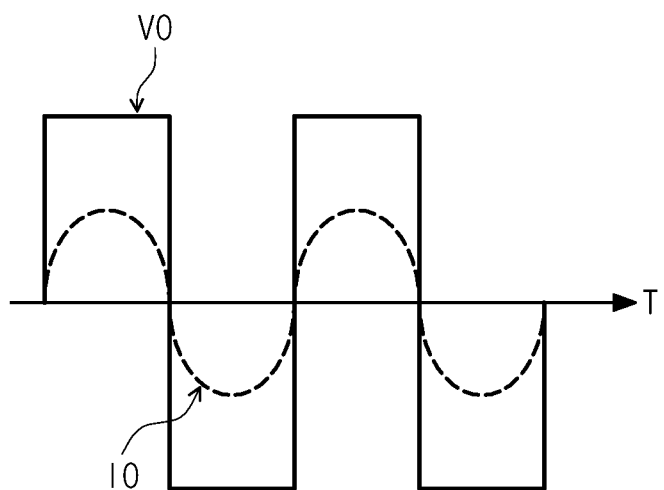
FIG. 5 illustrates an example of waveforms of an output voltage and an output current depending on lapse of time when a frequency of the output voltage and a resonant frequency of a load match each other.

FIG. 5 illustrates an example of waveforms of an output voltage VO and an output current IO depending on lapse of time T when a frequency fsw of the output voltage VO and a resonant frequency f0 of a load 140 match each other. Referring to FIGS. 1, 2, and 5, phases of the output voltage VO and the output current IO may match each other when the frequency fsw of the output voltage VO and the resonant frequency f0 of the load 140 match each other.

As an example, the resonant frequency f0 of the load 140 may be determined by an inductor Lpla of the load 140 and a capacitor C of the impedance matching circuit 130. The resonant frequency f0 of the load 140 may be determined by Equation (1).

$$f0 = \frac{1}{2\pi\sqrt{Lpla \cdot C}} \qquad \text{Equation (1)}$$

Figure 6:
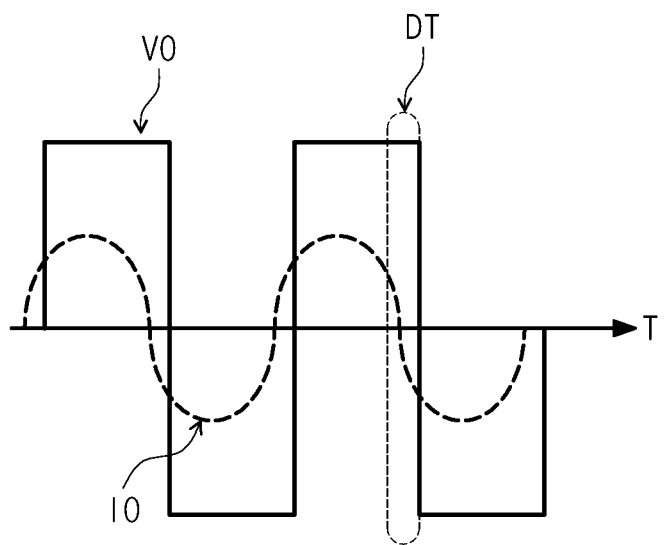
FIG. 6 illustrates an example of waveforms of an output voltage and an output current depending on lapse of time when a frequency of the output voltage is lower than a resonant frequency of a load.

FIG. 6 illustrates an example of waveforms of an output voltage VO and an output current IO depending on lapse of time T when a frequency fsw of the output voltage VO is lower than a resonant frequency f0 of a load 140. Referring to FIGS. 1, 2, and 6, a phase of the output voltage VO may lag behind a phase of the output current IO when the frequency fsw of the output voltage VO is lower than the resonant frequency f0 of a load 140.

Figure 7:
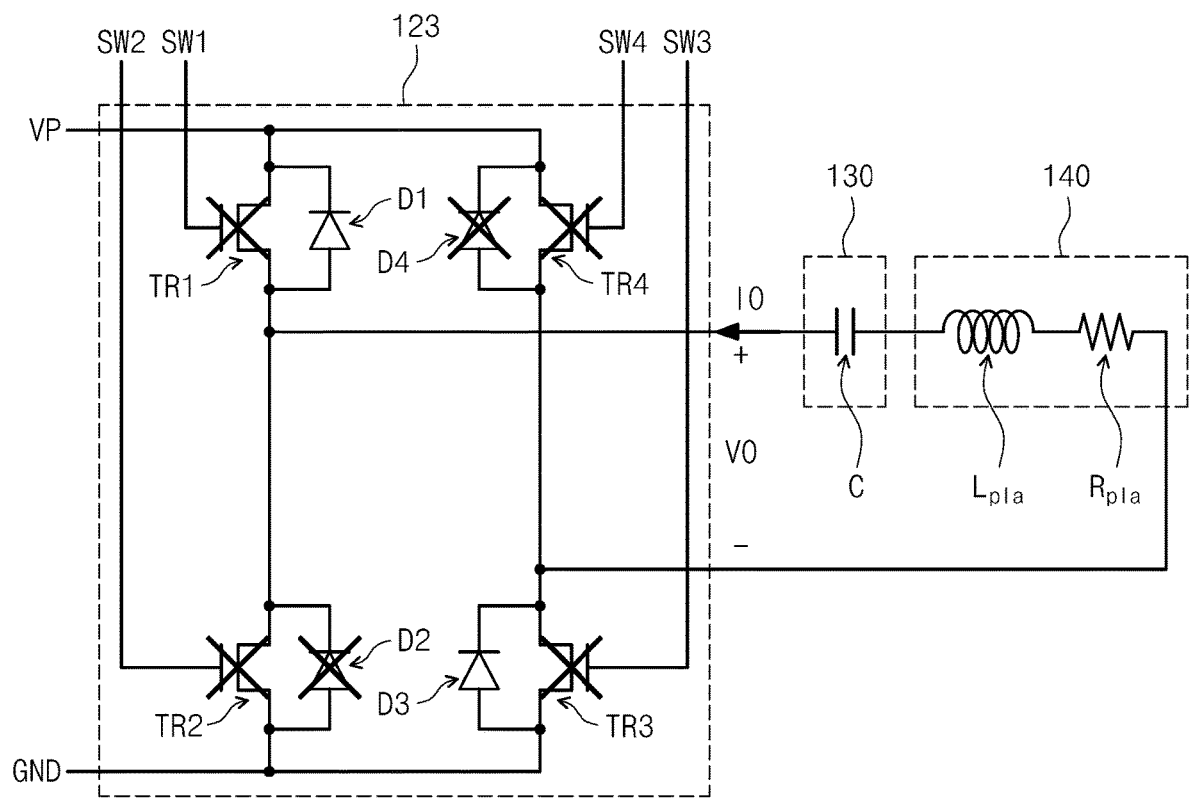
FIG. 7 illustrates an operating state of an inverter when an output voltage transitions from a high level to a low level according to the waveform of FIG. 6.

FIG. 7 illustrates an operating state of an inverter 123 when an output voltage VO transitions from a high level to a low level according to the waveform of FIG. 6. Referring to FIGS. 4, 6, and 7, there may be dead time DT when the output voltage VO transitions from a high level to a low level. For the dead time DT, the first to fourth transistors TR1 to TR4 may be turned off.

The output current IO flows to the inverter 123 from the load 140 and the impedance matching circuit 130. Due to a direction of the output current IO, the second and fourth diodes D2 and D4 do not pass the current, and the first and third diodes D1 and D3 pass the current. That is, when the phase of the output voltage VO lags behind the phase of the output current IO, the output current IO flows to the inverter 130 from the load 140 and the impedance matching circuit 130 for the dead time DT.

As the output current IO flows, power may unnecessarily be consumed. Moreover, as the output current IO flows, the output voltage VO of the inverter 123 is maintained at a voltage difference between the power supply node VP and the ground node GND. The output voltage VO is applied to opposite ends of each of the second and fourth transistors TR2 and TR4.

When the dead time DT finishes, the second and fourth transistors TR2 and TR4 are turned on while a high voltage (for example, the output voltage VO) is applied to opposite ends of each of the second and fourth transistors TR2 and TR4, which may be an unnecessary stress applied to the second and fourth transistors TR2 and TR4 and may degrade the second and fourth transistors TR2 and TR4.

Since the first to fourth transistors TR1 to TR4 of the inverter 123 are symmetrically disposed, the same phenomenon may occur in the first and third transistors TR1 and TR3. For example, for the dead time DT when the output voltage VO transitions from a low level to a high level, power may be unnecessarily consumed and a stress may be generated in the first and third transistors TR1 and TR3.

Figure 8:
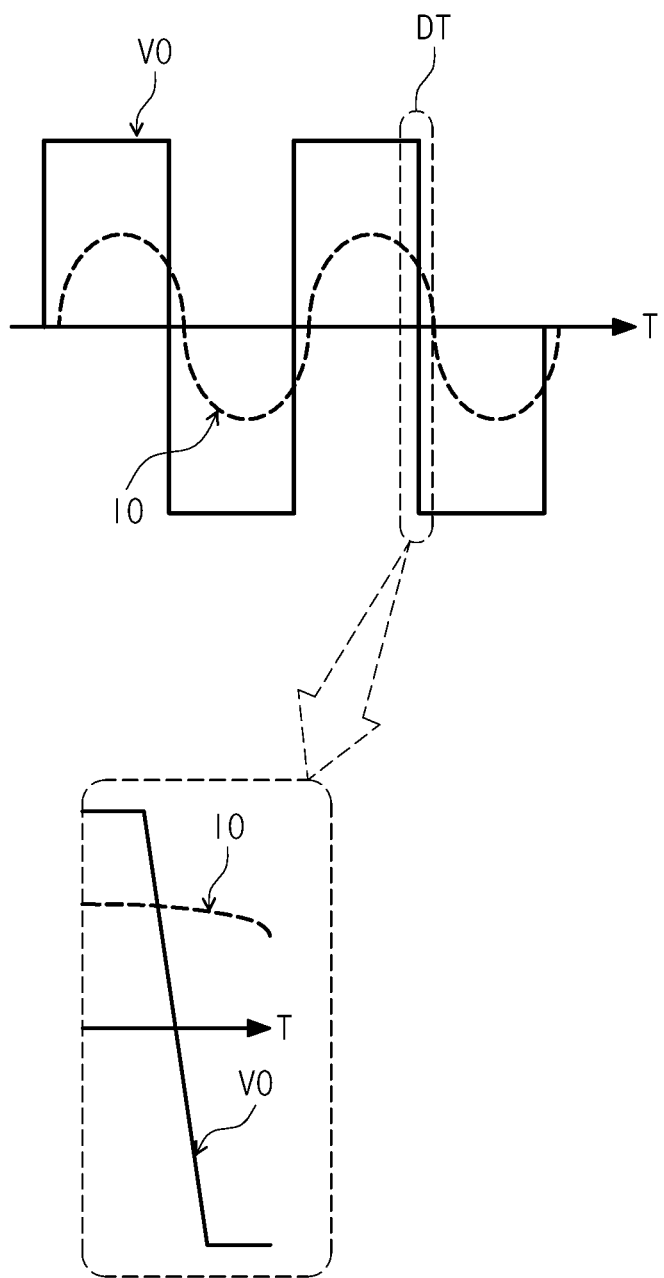
FIG. 8 illustrates an example of waveforms of an output voltage and an output current depending on lapse of time when a frequency of the output voltage is higher than a resonant frequency of a load match each other.

FIG. 8 illustrates an example of waveforms of an output voltage VO and an output current IO depending on lapse of time T when a frequency fsw of the output voltage VO is higher than a resonant frequency f0 of a load 140 match each other. Referring to FIGS. 1, 2, and 8, a phase of the output voltage VO may lead a phase of the output current IO when the frequency fsw of the output voltage VO is higher than the resonant frequency f0 of the load 140.

Figure 9:
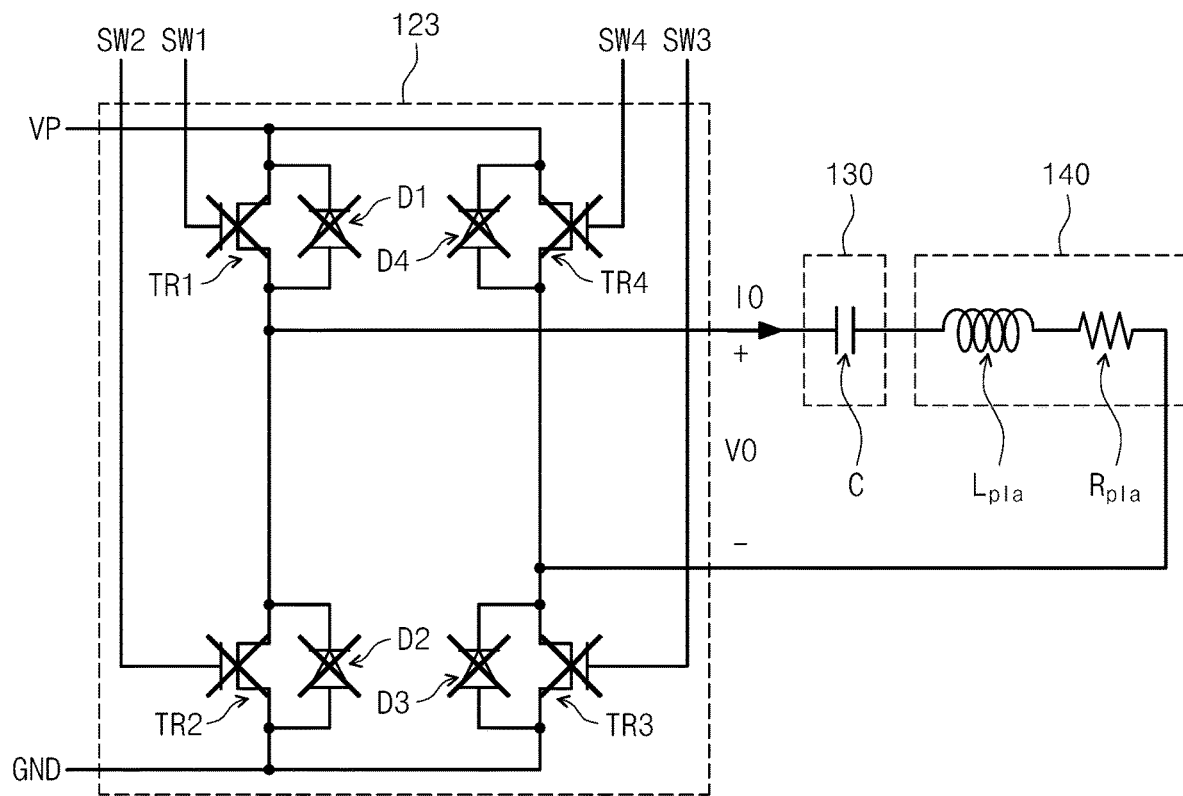
FIG. 9 illustrates an operating state of an inverter when an output voltage transitions from a high level to a low level according to the waveform of FIG. 8.

FIG. 9 illustrates an operating state of the inverter 123 when an output voltage VO transitions from a high level to a low level according to the waveform of FIG. 8. Referring to FIGS. 4, 8 and 9, there may be dead time DT when the output voltage VO transitions from a high level to a low level. For the dead time DT, the first to fourth transistors TR1 to TR4 may be turned off.

Since the output current IO has a positive value, the output current IO flows from the inverter 123 to the impedance matching circuit 130 and the load 140. A direction of the output current IO may prevent the output current IO from flowing through the first to fourth diodes D1 to D4. Instead, the output current IO may flow through parasitic capacitors (not shown) of the first and third transistors TR1 and TR3.

As the output current IO flows, opposite end voltages of each of the first and third transistors TR1 and TR3 may increase by a voltage difference between the power supply node VP and the ground node GND. Resonance (for example, parasitic resonance) may occur due to the parasitic capacitors (not shown) of the first and third transistors TR1 and TR3 and parasitic inductors (not shown) of wirings when the output current IO flows. The parasitic resonance increases as the intensity of the output current IO increases, and may high-frequency switching noise.

While the output current flows through the first and third transistors TR1 and TR3, the first and third transistors TR1 and TR3 are turned off at the dead time DT, which may act as a stress on the first and third transistors TR1 and TR3. Since the first to fourth transistors TR1 to TR4 are symmetrically disposed, the same high-frequency switching noise and stress may be generated in the second and fourth transistors TR2 and TR4 when the output voltage VO transitions from the low level to the high level.

As described above, when the frequency fsw of the output voltage VO is different from the resonant frequency f0 of the load 140, a stress may be applied to the first to fourth transistors TR1 to TR4 or power may be unnecessarily consumed. Thus, the frequency fsw of the output voltage VO should be controlled similarly to the resonant frequency f0 of the load 140 to improve reliability and performance of the power supply 120.

In detail, the frequency fsw of the output voltage VO is slightly higher (for example, about 0.1 to 10 percent) than the resonance frequency f0 of the load 140. When the frequency fsw of the output voltage VO is slightly higher than the resonance frequency f0 of the load 140, the instantaneous intensity of the output current IO have a fine positive value (for example, 0.1 percent to 10 percent of a maximum) in the state of the dead time DT of FIG. 8.

In the situation described with reference to FIGS. 8 and 9, the first and third transistors TR1 and TR3 are turned off while a minute current flows. Therefore, the stress applied to the first and third transistors TR1 and TR3 is negligible. For the dead time DT, as the output current IO flows, the opposite end voltages of each of the first and third transistors TR1 and TR3 increase by a voltage difference between the power supply node VP and the ground node GND.

For the dead time DT, opposite end voltages of each of the second and fourth transistors TR2 and TR4 decrease to 0 volt (or a similar low volt) as the output current IO flows. That is, when the dead time DT finishes and the second and fourth transistors TR2 and TR4 are turned on, the opposite end voltages of each of the second and fourth transistors TR2 and TR4 are 0 volt. Therefore, the second and fourth transistors TR2 and TR4 are negligible.

Likewise, when the phase of the output voltage VO is controlled to minutely lead the phase of the output current IO (for example, 0.1% to 10%), transistors may perform a preferable switching operation called zero voltage nearly zero current switching (ZVZCS). According to the ZVZCS, the first to fourth transistors TR1 to TR4 of the inverter 123 may be stably controlled. The controller 125 may control the first to fourth switching signals SW1 to SW4 according to the ZVZCS.

To perform the ZVZCD, an operating frequency of the power supply 120 should match a resonant frequency of the load 140. The resonant frequency of the load 140 is determined depending on physical characteristics of the load 140. Accordingly, to match the operating frequency with the resonant frequency, the power supply 120 needs to understand the operating frequency and perform a function to match the operating frequency to the resonant frequency.

Figure 10:
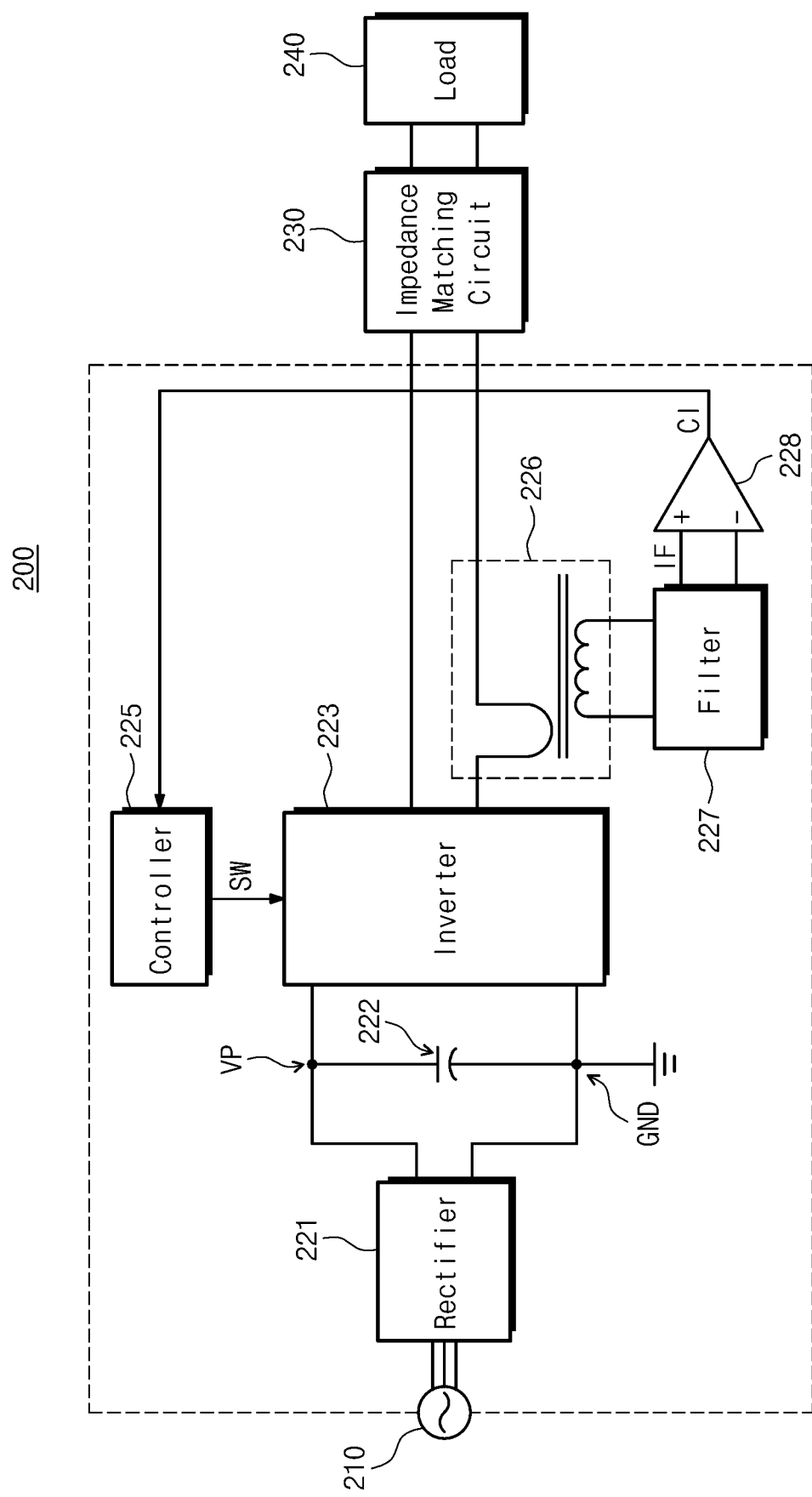
FIG. 10 is a block diagram of a power supply system according to an application example of the present disclosure.

FIG. 10 is a block diagram of a power supply system according to an application example of the present disclosure. Referring to FIG. 10, a power supply system 200 includes AC power 210, a power supply 220, and a load 240. The power supply 220 includes a rectifier 221, a capacitor 222, an inverter 223, a controller 225, a transformer 226, a filter 227, and a comparator 228.

The rectifier 221, the capacitor 222, the inverter 223, and the impedance matching circuit 230 have the same structures as described with reference to FIG. 1 and operate in the same manner. Therefore, duplicate description of the rectifier 221, the capacitor 222, the inverter 223, and the impedance matching circuit 230 will be omitted herein.

Referring to FIGS. 2 and 10, the transformer 226 may be inductively coupled to a wiring between the impedance matching circuit 230 and the inverter 223. The transformer 226 may generate a signal (for example, a second signal) similar to a signal (for example, a first signal) provided to the impedance matching circuit 230 and may output the generated signal to the filter 227. A voltage of the first signal may be an output voltage VO, and a current of the first signal may be an output current IO.

A voltage of the second signal may have a level determined by the inductive coupling from the output voltage VO. A current of the second signal may have an amount determined by the inductive coupling from the output current IO. A phase of the current of the second signal may be the same as a phase of the output current IO or may have a predetermined phase difference (for example, 180 degrees).

The filter 227 may perform high-pass filtering or low-band rejection filtering on the second signal output from the transformer 226. For example, the filter 227 may remove a DC component of the second signal. The filter 227 may output a filtered current IF to the comparator 228.

The comparator 228 may detect phase information CI from the filtered current IF. The phase information CI may include information on the phase of the output current IO. The phase information CI is transmitted to the controller 225. The controller 225 may detect a phase difference (or delay time) between the output voltage VO and the output current IO using at least one of switching signals SW and the phase information CI.

The controller 225 may adjust a frequency fsw of the output voltage VO based on the detected phase difference (or the delay time). When the frequency fsw of the output voltage VO is adjusted, the phase difference between the output voltage VO and the output current IO is adjusted as described with reference to FIGS. 5 to 9. The controller 225 may adjust the frequency fsw of the output voltage VO such that the phases of the output voltage VO and the output current IO are rendered to be equal (or no delay time exists) or the phase difference (or delay time) falls within a predetermined range VO.

Figure 11:
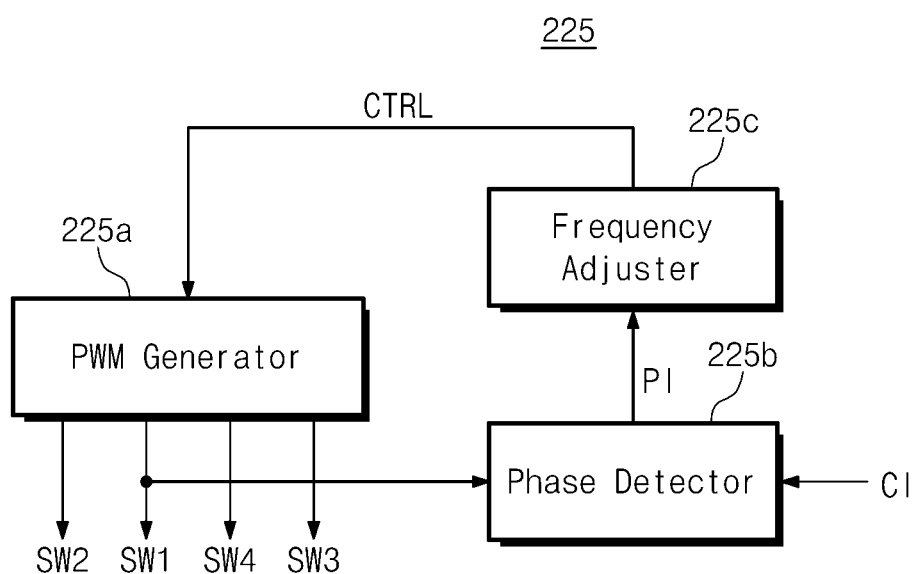
FIG. 11 is a block diagram illustrating an example of a controller in FIG. 10.

FIG. 11 is a block diagram illustrating an example of the controller 225 in FIG. 10. Referring to FIGS. 2, 10, and 11, the controller 225 includes a pulse width modulation (PWM)

generator 225a, a phase detector 225b, and a frequency adjuster 225c. The PWM generator 225a may control first to fourth switching signals SW1 to SW4. For example, the PWM generator 225a may control frequencies, dead times, freewheeling intervals, and the like of the first to fourth switching signals SW1 to SW4.

The phase detector 225b may receive the first switching signal SW1 and receive phase information CI. The phase detector 225b may distinguish delay time PI or a phase difference from the first switching signal SW1 and the phase information CI. The delay time PI is transmitted to the frequency adjuster 225c. The frequency adjuster 225c may control the PWM generator 225a through a control signal CTRL.

For example, the frequency adjuster 225c may control the control signal CTRL such that the frequencies of the first to fourth switching signals SW1 to SW4 are increased, decreased, or maintained by a predetermined unit in response to the delay time PI. The frequency adjuster 225c may control the control signal CTRL such that the frequencies of the switching signals SW1 to SW4 are increased, decreased, or maintained by a value corresponding to the delay time PI with reference to a predetermined lookup table.

For example, the frequency adjuster 225c may include a calculator (not shown) configured to calculate a frequency adjustment amount corresponding to the delay time PI using a predetermined function. The frequency adjuster 225c may control the control signal CTRL such that the frequencies of the first to fourth switching signals SW1 to SW4 are increased, decreased, or maintained according to an operation result of an operator.

Figure 12:
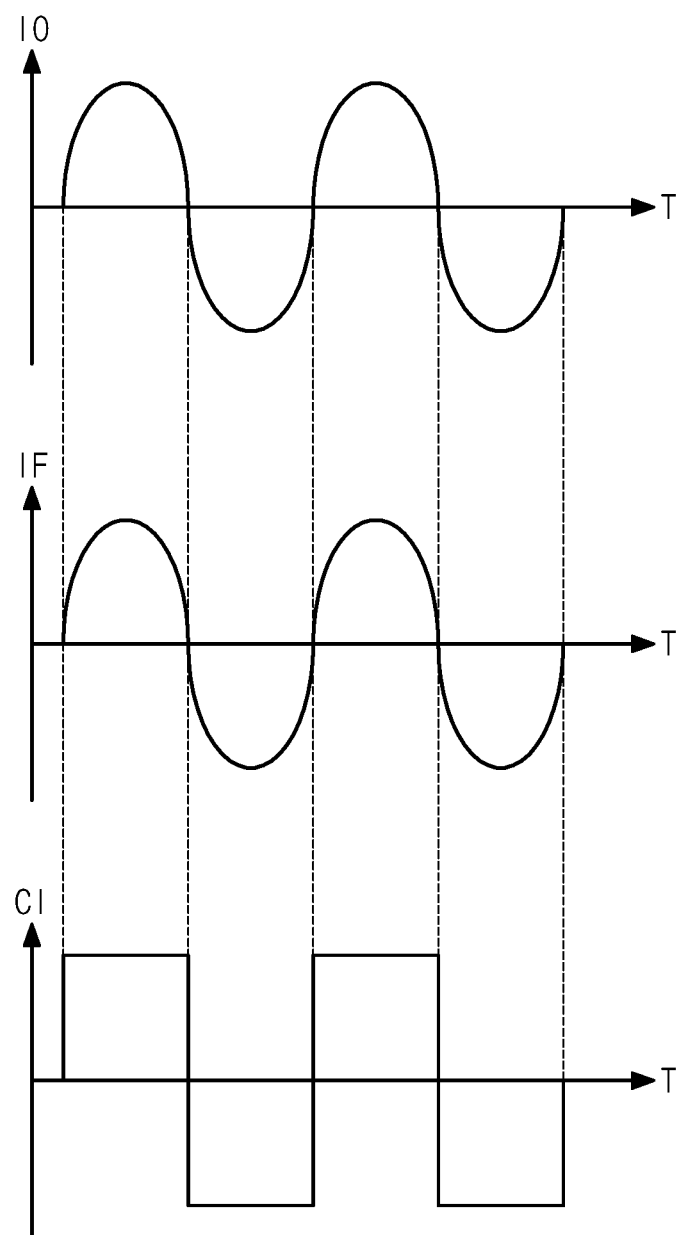
FIG. 12 illustrates an example in which a filtered current and phase information are detected from an output current.

FIG. 12 illustrates an example in which a filtered current IF and phase information CI are detected from an output current IO. In FIG. 12, the horizontal axes indicate time T, and vertical axes indicate an output current IO, a filtered current IF, and phase information CI, respectively. Referring to FIGS. 2, 10, 11, and 12, the filtered current IF may have the same phase as the output current IO. No delay time may exist between the filtered current IF and the output current IO.

The phase information CI is a result of comparing the filtered current IF with the comparator 228. When the filtered current IF has a positive value, the phase information CI has a high level. When the filtered current IF has a negative value, the phase information CI has a low level. Accordingly, the phase information CI may be the result of detecting only phase information in the filtered current IF.

Figure 13:
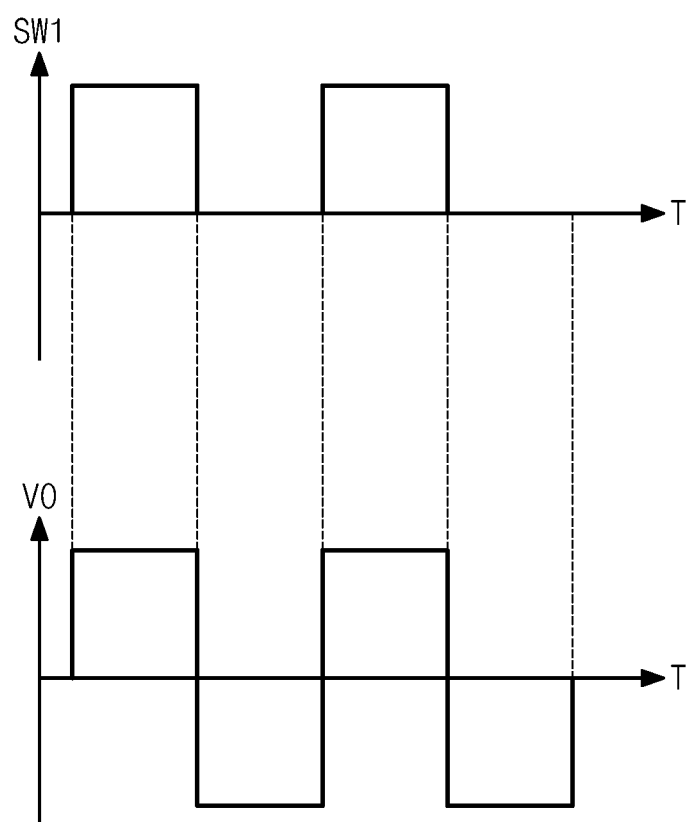
FIG. 13 illustrates an example of phases of a first switching signal and an output voltage.

FIG. 13 illustrates an example of phases of a first switching signal SW1 and an output voltage VO. Referring to FIGS. 2, 10, 11, and 13, when the first switching signal SW1 has a high level, the output voltage VO has a high level. When the second switching signal SW2 has a high level (for example, a ground level), the output voltage VO has a low level (for example, a negative voltage).

That is, a phase of the first switching signal SW1 matches a phase of the output voltage VO. Accordingly, the phase of the first switching signal SW1 may be used as the phase of the output voltage VO without detecting the phase of the output voltage VO. As an example, the third switching signal SW3 may be used in the same manner as the first switching signal SW1. Accordingly, the third switching signal SW3 may be used instead of the first switching signal SW1.

Figure 14:
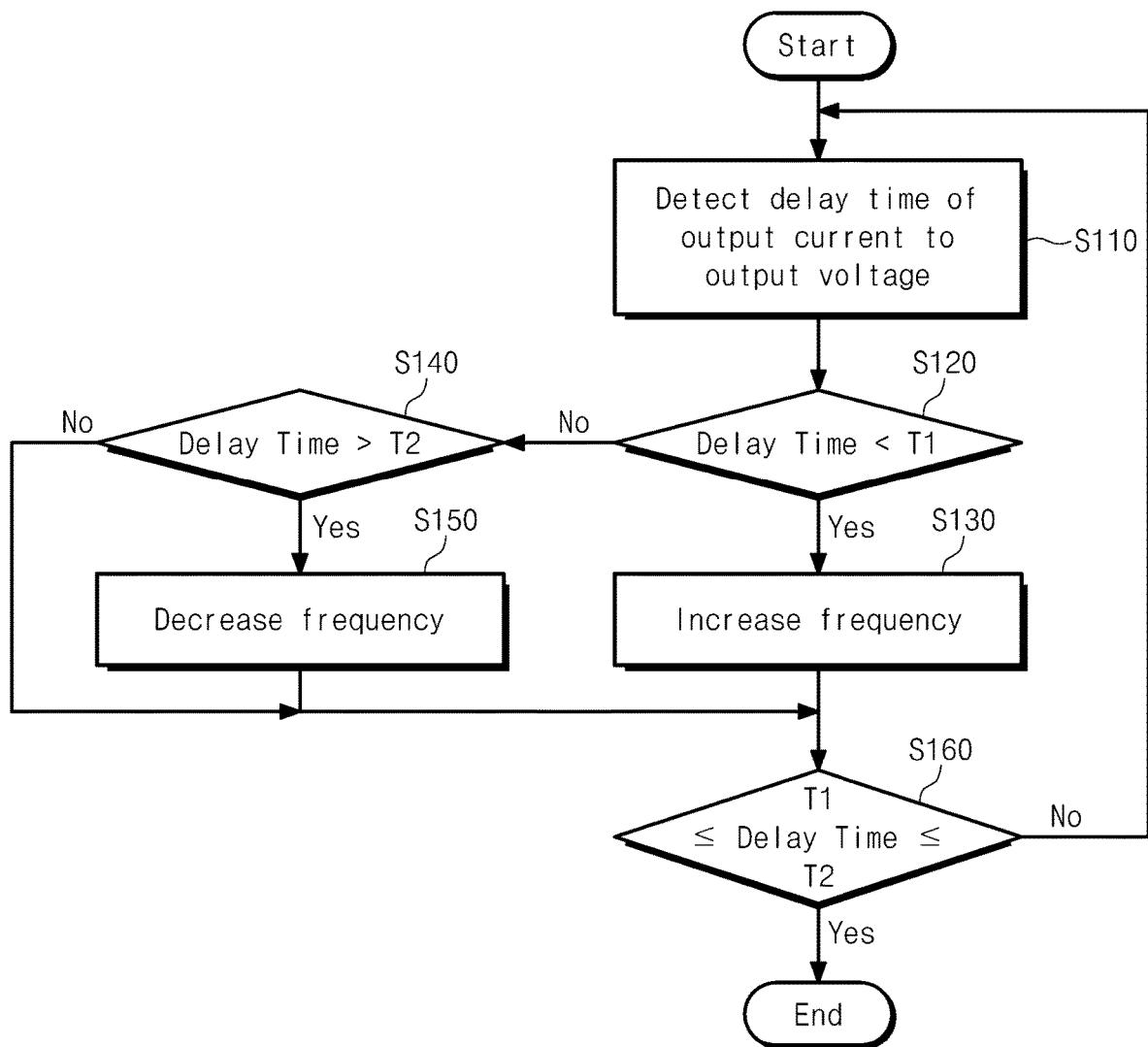
FIG. 14 illustrates an example of a method of controlling a frequency of an output voltage by a power supply.

FIG. 14 illustrates an example of a method of controlling a frequency of an output voltage by a power supply. Referring to FIGS. 2, 10, 11, and 14, the controller 225 may detect delay time PI of the output current IO with respect to the output voltage VO in operation S110. For example, the phase detector 225b may compare the first switching signal SW1 with the phase information CI to detect delay time PI.

In operation S120, the controller 225 determines whether the delay time PI is less than the first time T1. For example, the first time T1 may be −5 ns. When the delay time PI is less than the first time T1, the output current IO has a negative delay with respect to the output voltage VO. That is, the phase of the output current IO leads the phase of the output voltage VO.

In operation S130, the frequency adjuster 225c may increase the frequencies of the first to fourth switching signals SW1 to SW4. As the frequencies of the first to fourth switching signals SW1 to SW4 are increased, the frequency of the output voltage VO is increased. When the frequency of the output voltage VO is increased, the output current IO is delayed from the current phase, as described with reference to FIG. 8. Accordingly, the delay time PI is increased. Then, the controller 225 performs operation S160.

When the delay time PI is not smaller than the first time T1, the controller 225 determines whether the delay time PI is greater than second time T2 in operation S140. For example, the second time T2 may be 15 ns. When the delay time PI is greater than the second time T2, the output current IO has a positive delay with respect to the output voltage VO. That is, the phase of the output current IO lags behind the phase of the output voltage VO.

In operation S150, the frequency adjuster 225c may decrease frequencies of the first to fourth switching signals SW1 through SW4. As the frequencies of the first to fourth switching signals SW1 to SW4 are decreased, the frequency of the output voltage VO is decreased. When the frequency of the output voltage VO is decreased, the output current IO leads the current phase as described with reference to FIG. 6. Accordingly, the delay time PI is decreased. Then, the controller 225 performs operation S160.

In operation S160, the controller 225 determines whether the delay time PI is greater than or equal to the first time T1 and less than or equal to the second time T2. For example, the controller 225 may determine whether the delay time PI falls within the range defined by the first and second times T1 and T2. When the delay time PI falls within the predetermined range, the controller 225 may terminate the frequency adjustment (or phase adjustment). When the delay time PI does not fall within the predetermined range, the controller 225 may perform operation S110 again.

As an example, in a power supply system in which a resonant frequency of the load 240 varies depending on environmental change, the controller 225 may return to operation S110 to continue to perform frequency monitoring.

Figure 15:
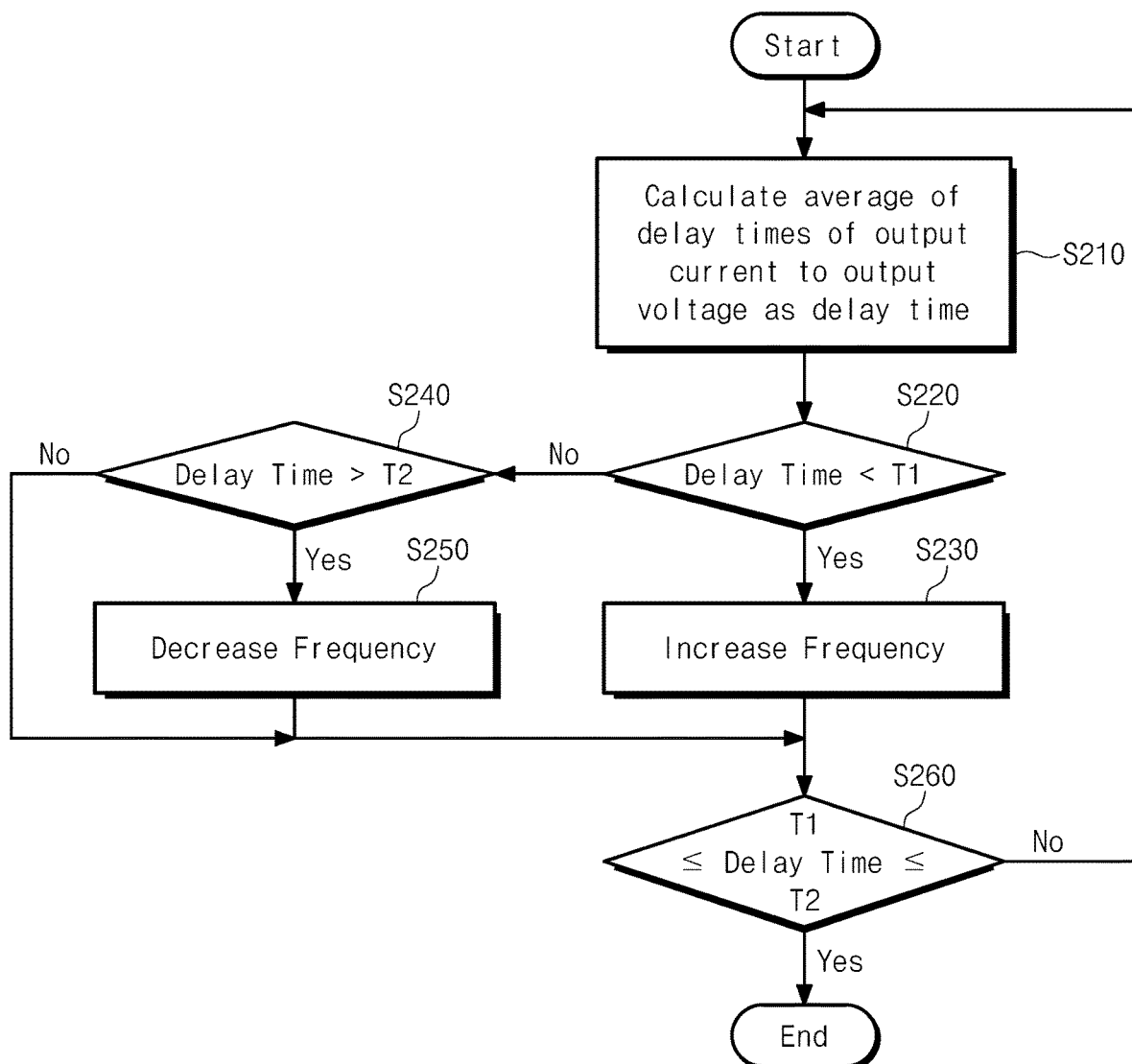
FIG. 15 illustrates another example of a method of controlling a frequency of an output voltage by a power supply.

FIG. 15 illustrates another example of a method of controlling a frequency of an output voltage VO by a power supply 220. Referring to FIGS. 2, 10, 11, and 15, in operation S210, the controller 225 may calculate an average of delay time PI of the output current IO to the output voltage VO.

For example, the phase detector 225b may store k delay times that are continuously detected (k being a positive integer). When the k delay times are stored, the phase detector 225b may calculate an average of the delay times. As an example, the controller 225 may adjust a value of k when an environmental change is detected, the value of k may be adjusted according to a request of the external device or a user's request. As another example, the value of k may be a fixed value that is not be changed.

When the average of the delay times is calculated, the phase detector 225b may output an average of the delay times as delay time PI. After outputting the delay time PI, the phase detector 225b may reset (for example, erase) the stored delay times. The phase detector 225b may start to collect the k delay times to calculate the next average.

In operation S220, the controller 225 determines whether the delay time PI is less than the first time T1. When the delay time PI is less than first time T1, the frequency adjuster 225c may increase frequencies of the first to fourth switching signals SW1 to SW4 in operation S230. As the frequencies of the first to fourth switching signals SW1 to SW4 are increased, the frequency of the output voltage VO is increased.

When the delay time PI is not less than the first time T1, the controller 225 determines whether the delay time PI is greater than the second time T2 in operation S240. When the delay time PI is greater than the second time T2, the frequency adjuster 225c may decrease the frequencies of the first to fourth switching signals SW1 to SW4 in operation S250. As the frequencies of the first to fourth switching signals SW1 to SW4 are decreased, the frequency of the output voltage VO is decreased.

In operation S260, the controller 225 determines whether the delay time PI is greater than or equal to the first time T1 and less than or equal to the second time T2. For example, the controller 225 may determine whether the delay time PI falls within the range defined by the first and second times T1 and T2. When the delay time PI falls within a predetermined range, the controller 225 may terminate the frequency adjustment (or phase adjustment). When the delay time PI does not fall within the predetermined range, the controller 225 may perform the operation S210 again.

Figure 16:
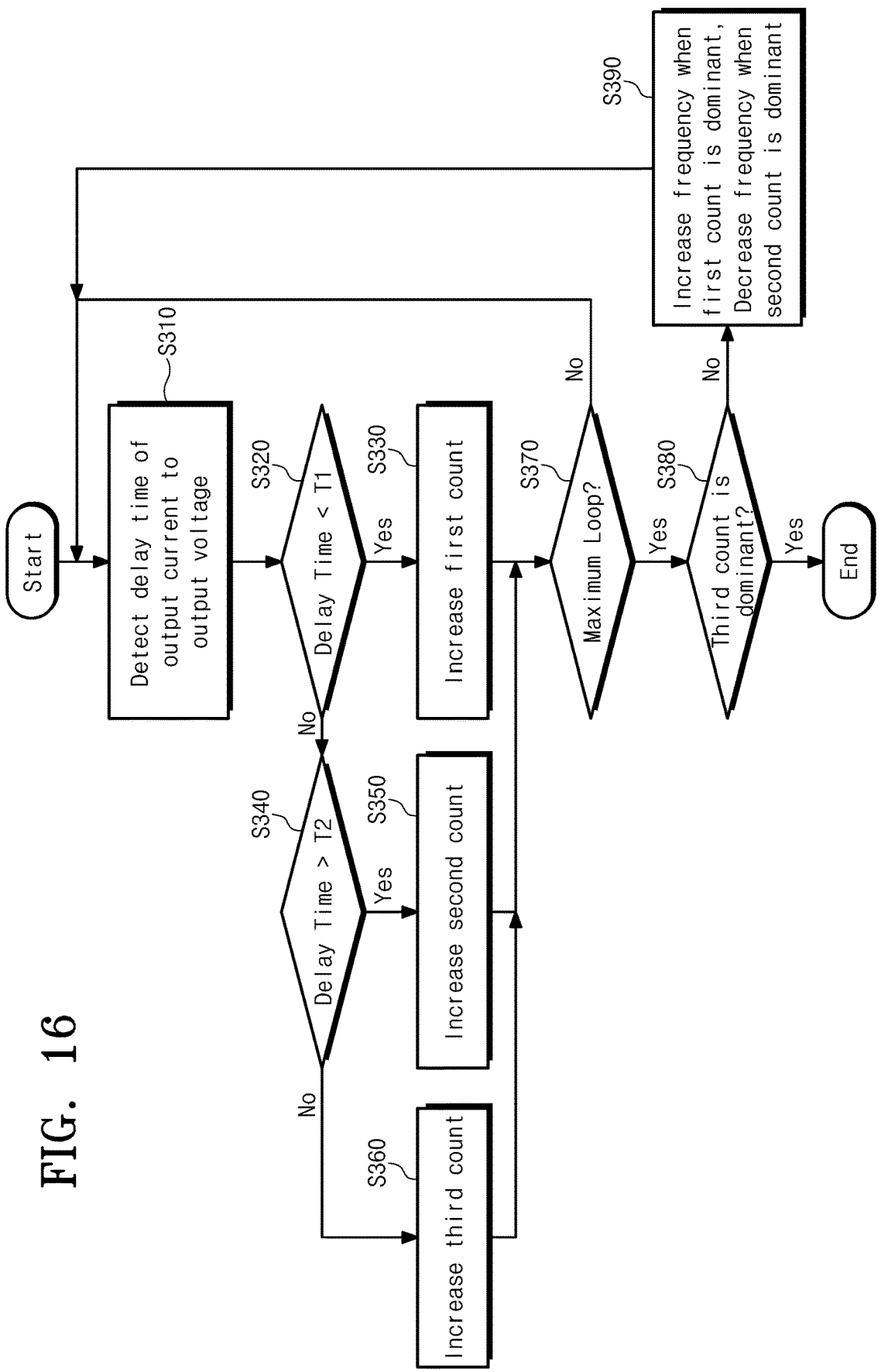
FIG. 16 illustrates another example of a method of controlling a frequency of an output voltage by a power supply.

FIG. 16 illustrates another example of a method of controlling a frequency of an output voltage VO by a power supply 220. Referring to FIGS. 2, 10, 11, and 16, in operation S310, the controller 225 may detect the delay time PI of the output current IO to the output voltage VO. In operation S320, the controller 225 determines whether the delay time PI is less than the first time T1. When the delay time PI is less than the first time T1, the phase detector 225b may increase the first count in operation S330. Then, the controller 225 may perform operation S370.

When the delay time PI is not less than the first time T1, the controller 225 determines whether the delay time PI is greater than the second time T2 in operation S340. When the delay time PI is greater than the second time T2, the phase detector 225b may increase the second count in operation S350. Then, the controller 225 may perform operation S370. When the delay time PI is not greater than the second time T2, the phase detector 225b may increase the third count in operation S360. Then, the controller 225 may perform operation S370.

In operation S370, the controller 225 determines whether a maximum loop was performed. For example, a single loop may include operations S310 to S360. The controller 225 may determine that the maximum loop was performed when the number of times the loops were performed reaches k (k being a positive integer). As an example, the controller 225 may adjust the value of k when an environmental change is detected, according to a request of an external device or a user's request. As another example, the value of k may be a fixed value that is not changed.

When the maximum loop was not performed, the controller 225 may start the next loop in operation S310. When the maximum loop was performed, the controller 225 may reset the number of times the loops were performed and perform operation S390. In operation S390, the controller 225 may determine whether the third count is dominant. For example, when the third count is greater than or equal to k/3, then the third count may be dominant.

When the third count is dominant, the controller 225 may terminate adjustment of the delay time. When the third count is not dominant, the controller 225 may perform operation S390. In operation S390, the controller 225 may increase the frequencies of the first to fourth switching signals when the first count is dominant. The controller 225 may decrease the frequencies of the first to fourth switching signals when the second count is dominant.

As discussed above, the controller 225 may adjust a frequency fsw of the output voltage VO by collecting the k delay times and voting dominant one of the delay times. As an example, when n delay times (n being a positive integer less than k) less than the first time T1 are successively detected, the controller 225 increases the frequencies of the first to fourth switching signals without voting. Then, the number of times the loops were performed and the collected delay times may be initialized and operation S310 may be performed.

As an example, when n delay times greater than the second time T2 are successively detected, the controller 225 may decrease the frequencies of the first to fourth switching signals without voting. Additionally, when n delay times smaller than the first time T1 are successively detected, the controller 225 may increase the frequencies of the first to fourth switching signals without voting. Then, the number of times the loops were performed and the collected delay times may be initialized and operation S310 may be performed.

Figure 17:
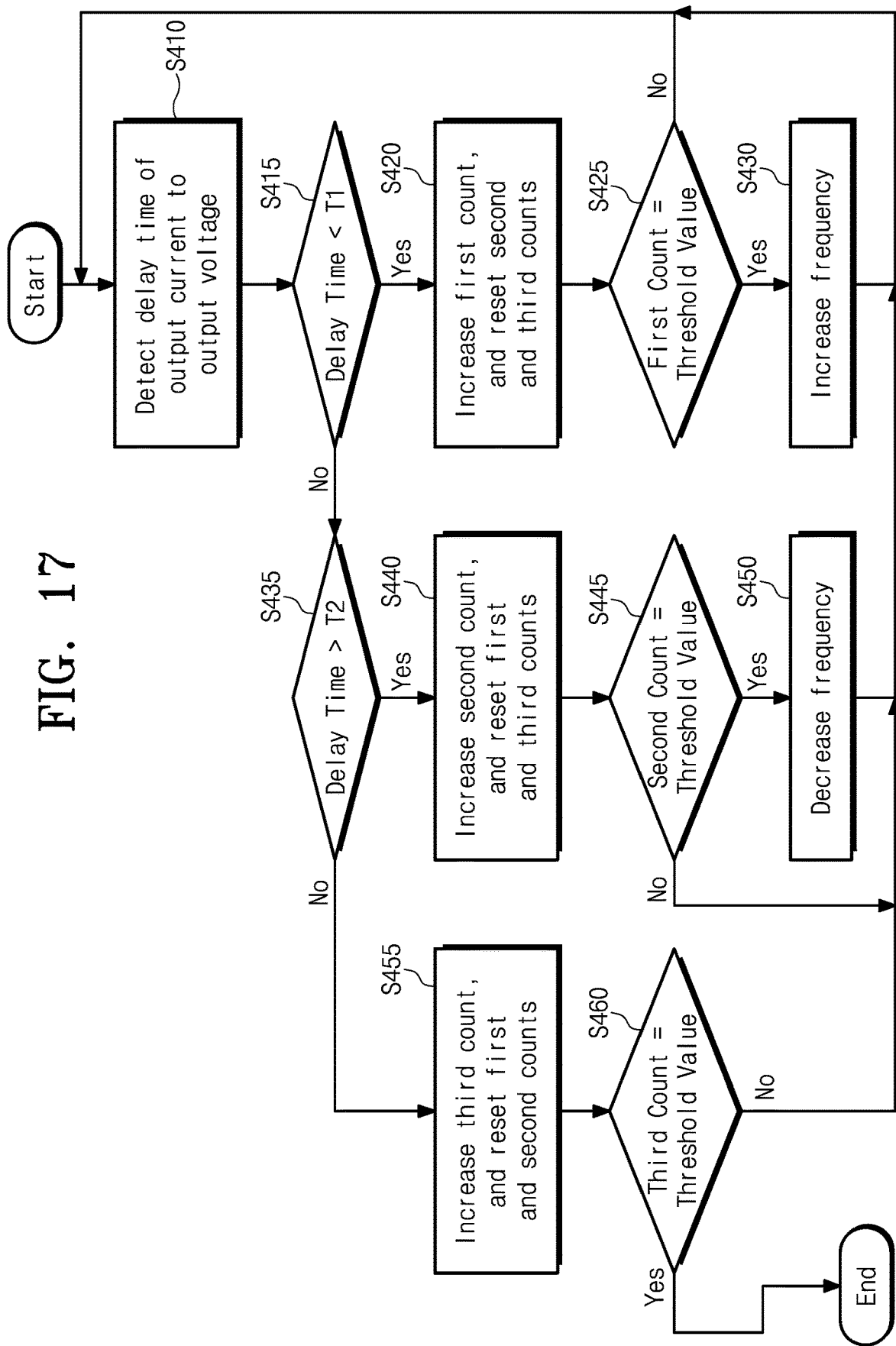
FIG. 17 illustrates another example of a method of adjusting a frequency of an output voltage by a power supply.

FIG. 17 illustrates another example of a method of adjusting a frequency of an output voltage VO by a power supply 220. Referring to FIGS. 2, 10, 11, and 17, in operation S410, the controller 225 may detect the delay time PI of the output current IO to the output voltage VO. In operation S415, the controller 225 determines whether the delay time PI is less than the first time T1. When the delay time PI is less than the first time T1, the phase detector 225b may increase the first count and reset the second and third counts in operation S400.

Then, in operation S425, the controller 225 may determine whether the first count reached a threshold value. When the first count is equal to the threshold value, the controller 225 may increase a frequency in operation S430. Then, operation S410 may be performed. When the first count is not equal to the threshold, operation S410 may be performed without adjusting the frequency.

When the delay time PI is not less than the first time T1, the controller 225 determines whether the delay time PI is greater than the second time T2 in operation S435. When the delay time PI is greater than the second time T2, the phase detector 225b may increase a second count and reset the first and third counts in operation S440.

Then, in operation S445, the controller 225 may determine whether the second count reached a threshold value. When the second count is equal to the threshold value, the controller 225 may decrease the frequency in operation S450. Then, operation S410 may be performed. When the second count is not equal to the threshold, operation S410 may be performed without adjusting the frequency.

When the delay time PI is not greater than the second time T2, the phase detector 225b may increase the third count and reset the first and second counts in operation S455. Then, in operation S460, the controller 225 may determine whether the third count reached a threshold value. When the third count is equal to the threshold value, the controller 225 may terminate the adjustment of the frequency. When the third count is not equal to the threshold, operation S410 may be performed without adjusting the frequency.

As described above, when the delay times continuously exhibit the same characteristics, the controller 225 can adjust a frequency or terminate the adjustment of the frequency according to the characteristics.

Figure 18:
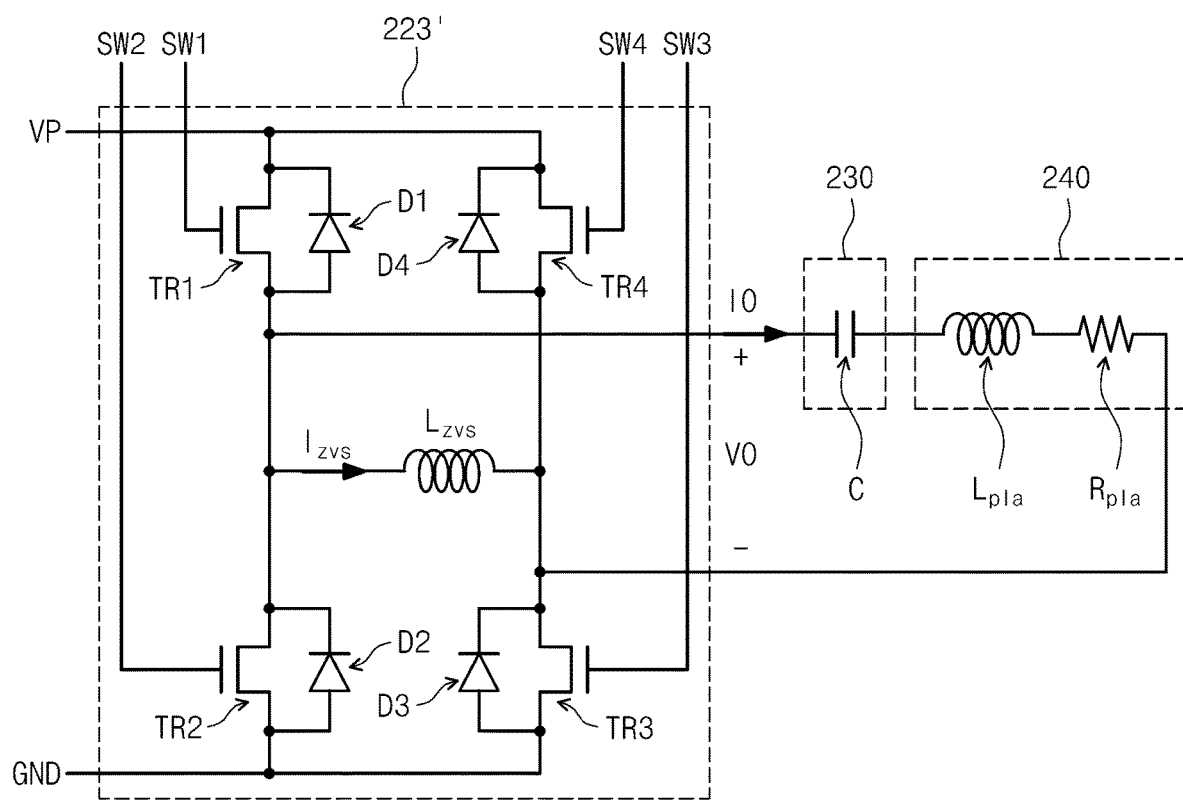
FIG. 18 illustrates an inverter, an impedance matching circuit, and a load according to an application example of the present disclosure.

FIG. 18 illustrates an inverter 223', an impedance matching circuit 230', and a load 240 according to an application example of the present disclosure. Referring to FIGS. 10 and 18, the inverter 223' may include first to fourth transistors TR1 to TR4, first to fourth diodes D1 to D4, and an inductor Lzvs.

As compared to the inverter 123 in FIG. 2, the inverter 223' further includes an inductor Lzvs. The inductor Lzvs may be coupled between output nodes to which the output voltage VO is output. A current flowing through the inductor Lzvs may be an inductor current Izvs. The first to fourth transistors TR1 to TR4 and the first to fourth diodes D1 to D4 may be connected and operate in the same manner as described with reference to FIG. 2.

Figure 19:
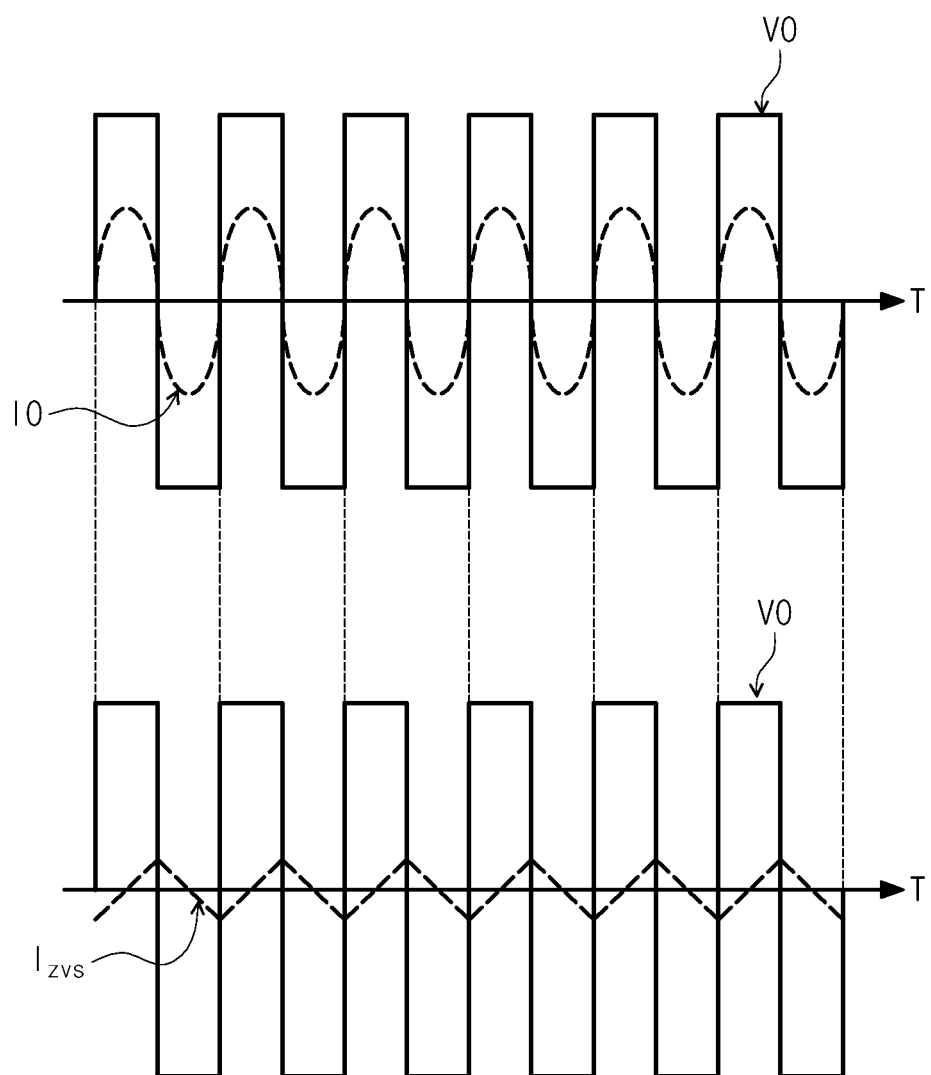
FIG. 19 illustrates variations in an output current and an inductor current with the lapse of time.

FIG. 19 illustrates variations in an output current IO and an inductor current Izvs with the lapse of time T. FIGS. 1, 19, and 19, a phase of the output voltage VO may match a phase of the output current IO. The inductor current Izvs may act as a counter electromotive force of the output current IO. The inductor current Izvs has a negative value when the output current IO increases, and the inductor current Izvs may have a positive value when the output current IO decreases.

When the phases of the output voltage VO and the output current IO match each other, the output current IO may not flow during a dead time DT (see FIG. 4) in which the output voltage VO transitions from a high level to a low level. At this point, a positive current flows in the inverter 123' due to the inductor current Izvs.

Similarly, when the phases of the output voltage VO and the output current IO match each other, the output current IO may not flow during a dead time in which the output voltage VO transitions from a low level to a high level. At this point, a negative current flows in the inverter 123' due to the inductor current Izvs. Zero voltage nearly zero current switching (ZVZCS) may be achieved in the inverter 123' due to the inductor current Izvs.

Figure 20:
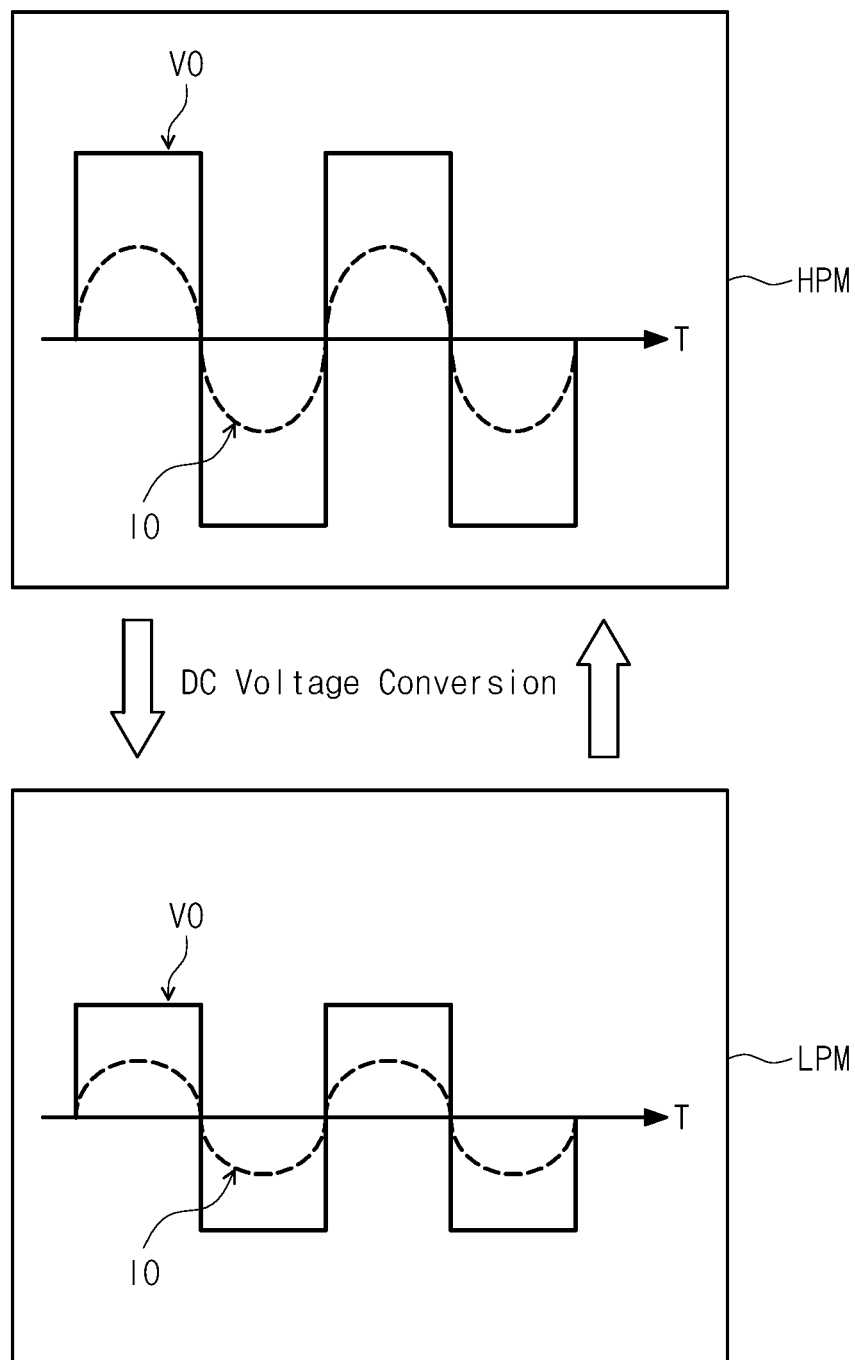
FIG. 20 illustrates an example of a method of controlling power depending on DC voltage conversion.

Power supplied to the load 240, for example, the amount of power per unit time may be controlled to precisely control the operation of the load 240. Various methods may be used to control the power supplied to the load 240. FIG. 20 illustrates an example of a method of controlling power depending on DC voltage conversion. Referring to FIG. 20, a maximum value of an output voltage VO may be adjusted depending on the DC voltage conversion.

When the DC voltage conversion is used, phases of the output voltage VO and an output current IO remain unchanged. Accordingly, the use of the DC voltage conversion results in an advantage that the operation of an inverter 220 is stable. On the other hand, the use of the DC voltage conversion needs a separate DC-DC converter configured to perform the DC voltage conversion of a power supply VP. In addition, the use of the DC voltage conversion encounters disadvantages that time is required to perform DC-DC conversion and a power control speed is low.

Figure 21:
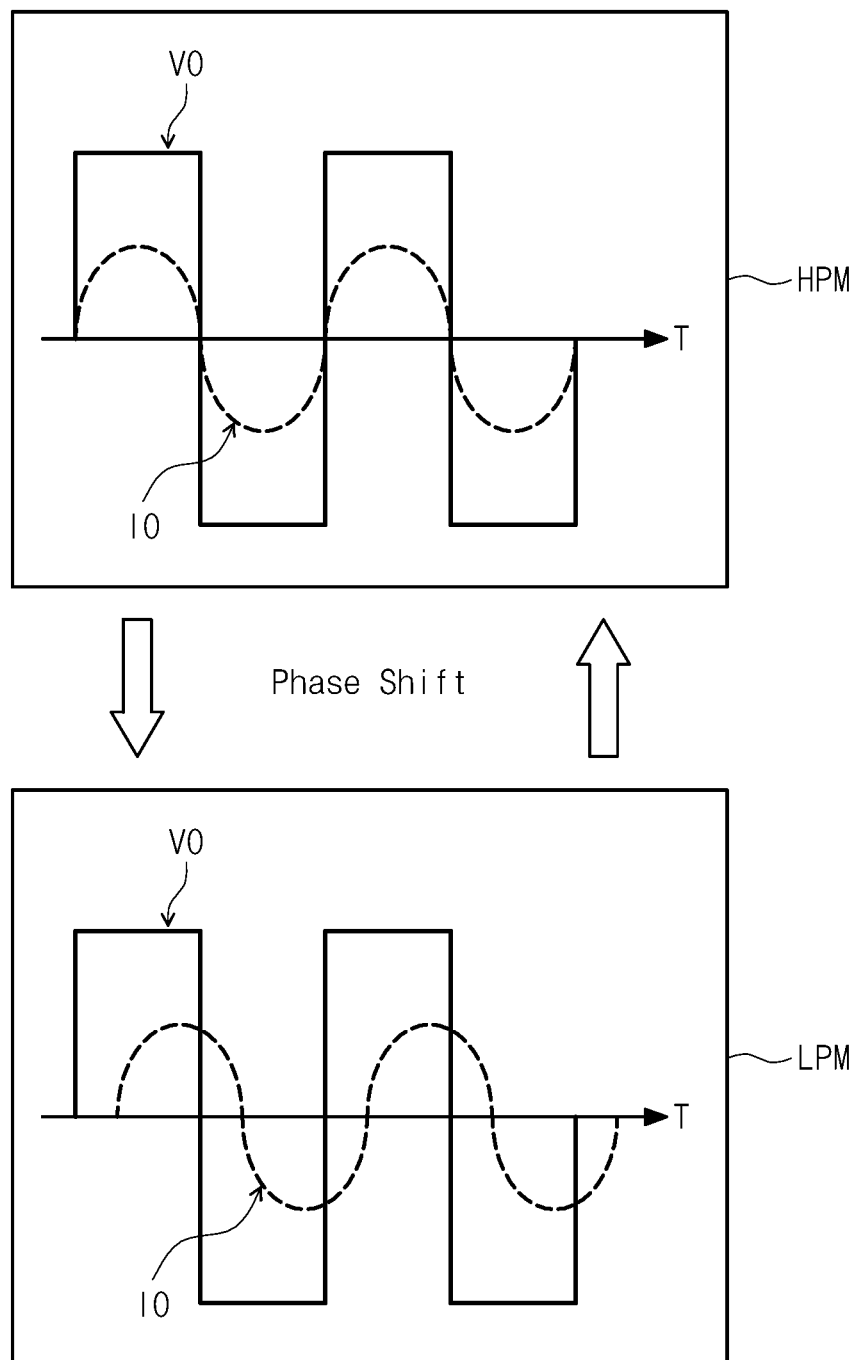
FIG. 21 illustrates an example of a method of controlling power depending on phase shift.

FIG. 21 illustrates an example of a method of controlling power depending on phase shift. Referring to FIG. 21, a phase difference between an output voltage VO and an output current IO may be adjusted depending on phase shift.

When an area of the overlapping region is reduced due to the phase difference between the output voltage VO and the output current IO, power supplied to a load 240 is decreased. Accordingly, the power supplied to the load 240a may be adjusted by adjusting a frequency fsw of the output voltage VO.

Since the power is adjusted by adjusting the frequency fsw of the output voltage VO, the power may be adjusted relatively rapidly. However, as described with reference to FIGS. 5 to 9, stress may be applied to the first to fourth transistors TR1 to TR4 when the phases of the output voltage VO and the output current IO are different. Thus, stability of the inverter 220 (see FIG. 10) may be reduced.

Figure 22:
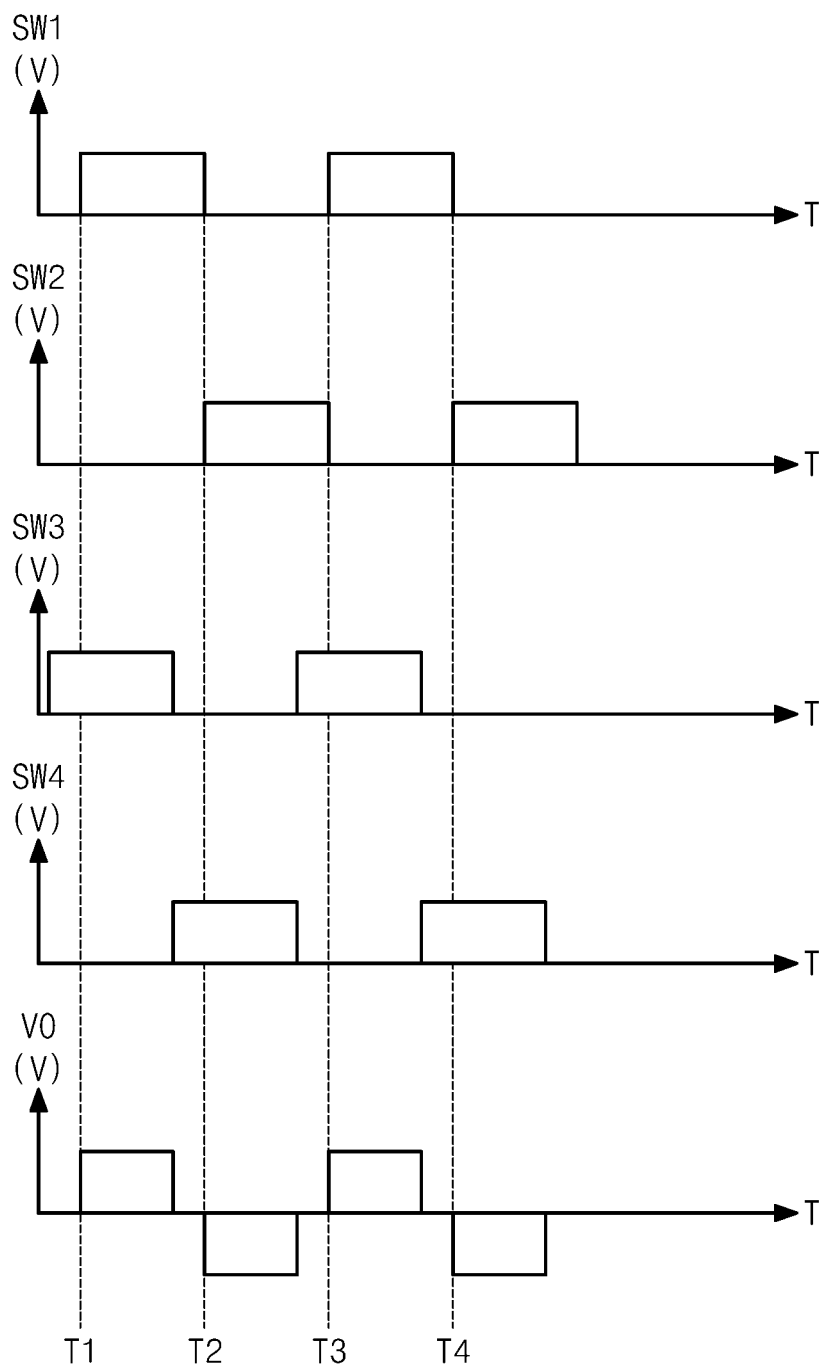
FIG. 22 illustrates an example in which first to fourth switching signals and an output voltage are adjusted according to pulse width modulation.

FIG. 22 illustrates an example in which first to fourth switching signals SW1 to SW4 and an output voltage VO are adjusted according to pulse width modulation. Referring to FIGS. 2 and 22, the first and second switching signals SW1 and SW2 may have the same phases as those described with reference to FIG. 3. The third and fourth switching signals SW3 and SW4 may have phases which lead those described with reference to FIG. 3.

The output voltage VO has a high level when both the first and third switching signals SW1 and SW3 have a high level. When the phase of the third switching signal SW3 leads the phase of the first switching signal SW1, a period in which both the first and third switching signals SW1 and SW3 have a high level is reduced. Thus, a period in which the output voltage VO has a high level is reduced.

The output voltage VO has a low level when both the second and fourth switching signals SW2 and SW4 have a high level. When the phase of the fourth switching signal SW4 leads than the phase of the second switching signal SW2, a period in which both the second and fourth switching signals SW2 and SW4 have a high level is reduced. Thus, the period in which the output voltage VO is low is reduced.

Figure 23:
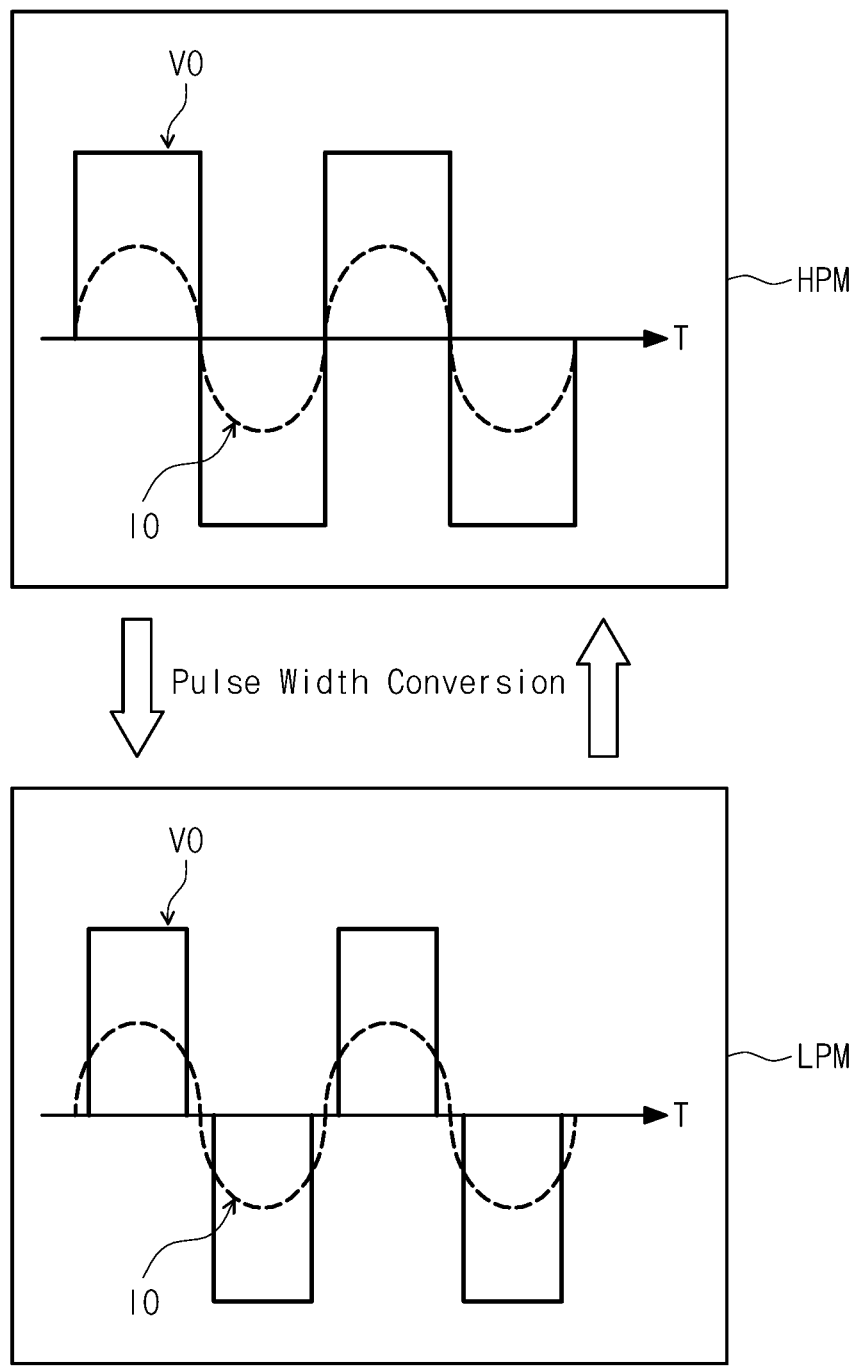
FIG. 23 illustrates an example of a method of controlling power according to pulse width modulation.

FIG. 23 illustrates an example of a method of controlling power according to pulse width modulation. Referring to FIG. 23, a pulse width of an output voltage VO may be adjusted using the pulse width modulation. When an area in which the output voltage Vo and an output current IO overlap each other is reduced, power supplied to the load 240 (see FIG. 10) is decreased. Thus, the pulse width of the output voltage VO may be modulated to adjust the power supplied to the load 240.

However, when the pulse width of the output voltage VO is decreased, some of the first to fourth transistors TR1 to TR4 may be switched when the output current IO has a positive value or a negative value. Accordingly, stress may be applied to the first to fourth transistors TR1 to TR4 and stability of the inverter 220 may be reduced.

Figure 24:
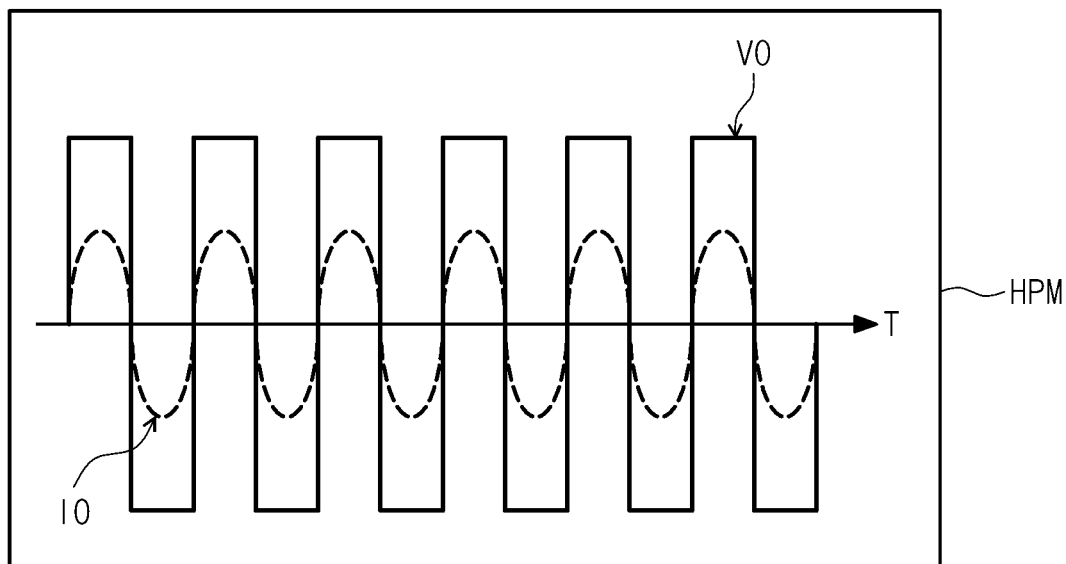
FIG. 24 illustrates a method of supplying power according to an example embodiment of the present disclosure.
Figure 24:
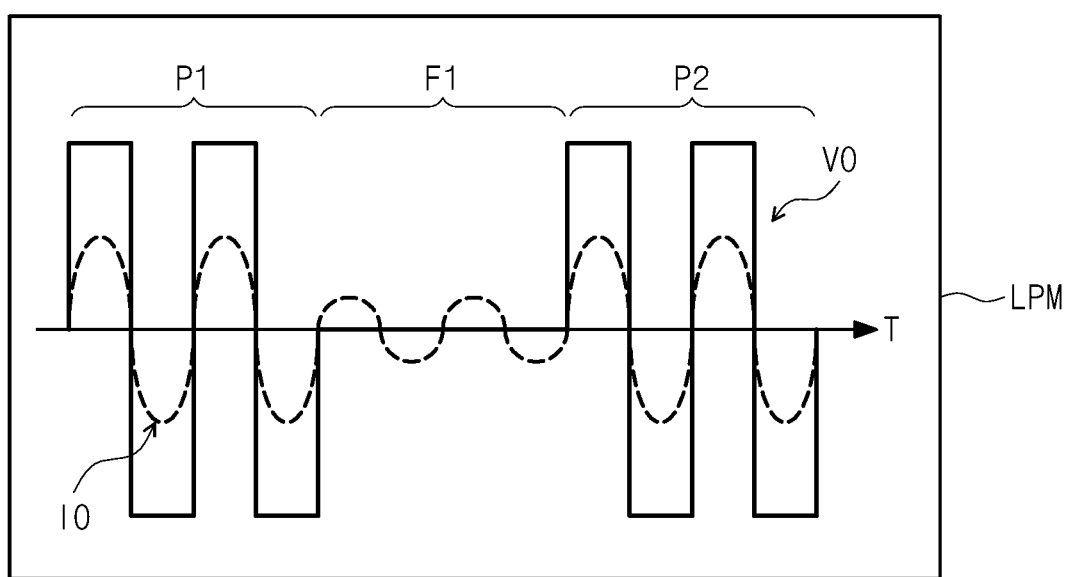

FIG. 24 illustrates a method of supplying power according to an example embodiment of the present disclosure. Referring to FIGS. 2, 10, and 24, the controller 225 may adjust power supplied to a load (e.g., amount of power per unit time) through freewheeling insertion. As an example, six periods of the output voltage VO are shown in 24. To describe the present inventive concept, it will be assumed that six cycles are unit time. However, the unit time required to adjust the amount of power is not limited to six periods of the output voltage VO.

In a high-power mode (HPM), the controller 225 may control the first to fourth switching signals SW1 to SW4 in the manner described with reference to FIG. 3 or FIG. 4. The output voltage VO may continuously transition, and the output current IO may also continuously transition. In a low-power mode (LPM), the controller 225 may control the first to fourth switching signals SW1 to SW4 according to a powering period and a freewheeling period.

A powering period may include first and second powering periods P1 and P2. In the first and second powering periods P1 and P2, the controller 225 may control the first to fourth switching signals SW1 to SW4 in the manner described with reference to FIG. 3 or 4. A freewheeling period may include a first freewheeling period F1. In the first freewheeling period F1, the controller 225 may control the first to fourth switching signals SW1 to SW4 such that the output voltage VO does not have a high level and a low level (for example, has a ground level).

For example, in the first freewheeling period F1, the controller 225 may maintain the first to fourth switching signals SW1 to SW4 at a low level. Since the output voltage VO is not supplied, the current amount of the output current IO in the first freewheeling period F1 may be smaller than the current amount of the output current IO in the first and second powering periods P1 and P2. The inverter 223 supplies power to the load 240 in the first and second powering periods P1 and P2 and does not supply power to the load 240 in the first freewheeling period F1.

The controller 225 may control the amount of power supplied to the load 240 for a unit time by adjusting a total length of a powering period and a total length of a freewheeling period for the unit time. The longer the freewheeling period, the less the amount of the power supplied to the load 240. The shorter the freewheeling period, the more the amount of the power supplied to the load 240. As an example, the power amount P may be calculated by Equation (2).

$$P = \left(\frac{1}{\sqrt{2}} \times \frac{4}{\pi} \times VVP \times \frac{(N-n)}{N}\right)^2 \times \frac{1}{Rpla} \quad \text{Equation (2)}$$

In Equation (2), VVP denotes a voltage at a power supply node VP, N denotes the number of total cycles included in a unit time, n denotes the number of all freewheeling periods included in the unit time. As an example, when the freewheeling period is adjusted in a half-cycle unit, N and n may be changed into the number of half-cycles. As shown in Equation (2), the power amount P may be adjusted according to a length of the powering period, that is, a length of the freewheeling period.

As an example, a freewheeling period may be distinguished from a dead time DT (see FIG. 4) in that the freewheeling period has a length greater than or equal to a half-cycle of the output voltage VO. The dead time DT may be shorter than the half-cycle of the output voltage VO. When the dead time DT has a length corresponding to a half-period of the output voltage VO, the phases of the output voltage VO and the output current IO are changed in each cycle. Accordingly, the power supply 220 does not operate normally.

Figure 25:
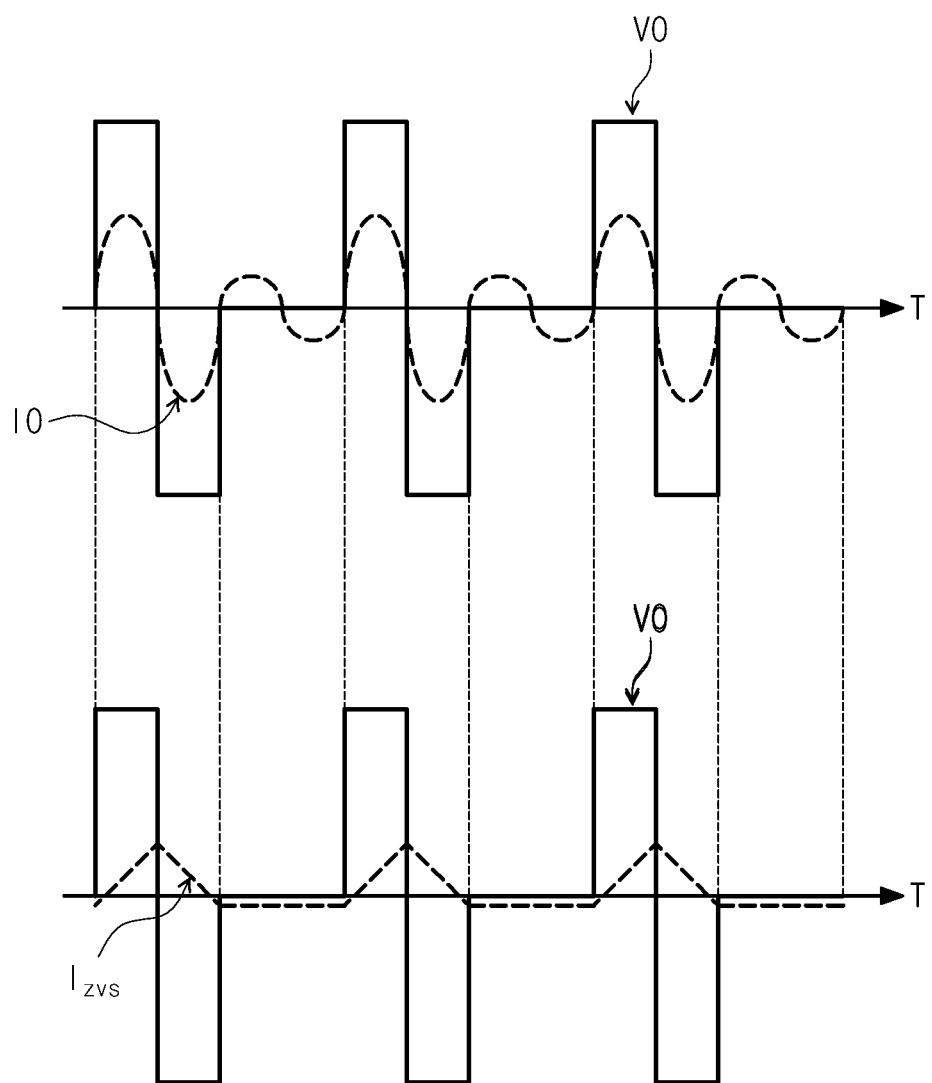
FIG. 25 illustrates an example of a variation in an inductor current when an output voltage has a freewheeling period.
Figure 27:
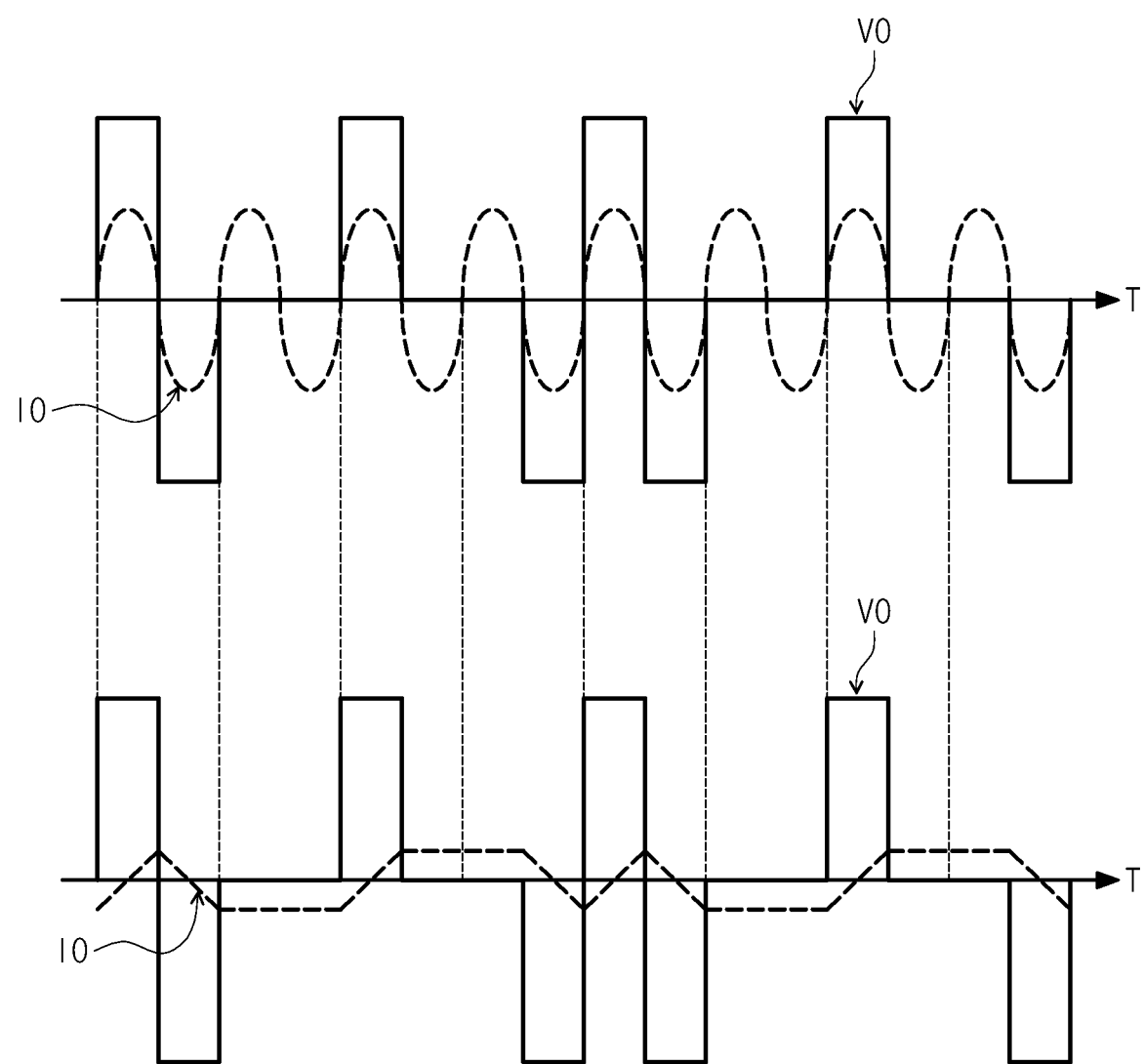
FIG. 27 illustrates another example of a variation in an inductor current when an output voltage has a freewheeling period.

FIG. 25 illustrates an example of a variation in an inductor current Izvs when an output voltage VO has a freewheeling period. Referring to FIGS. 1, 25, and 27, a powering period of one cycle and a freewheeling period of one cycle may be alternately arranged. The inductor current Izvs may be calculated using Equation (7).

$$I_{ZVS} = Iini + \frac{1}{L_{ZVS}} \int_0^\tau VO(t)dt \quad \text{Equation (3)}$$

In Equation (3), Iini denotes an initial current. During the freewheeling interval, the inductor current Izvs remains negative. Since the sum total (or average current) of the inductor currents Izvs should be zero, an absolute value of a positive peak value of the inductor current Izvs may be greater than an absolute value of a negative peak value of the inductor current Izvs. When the amount of inductor current Izvs flowing during the dead time DT varies, the inverter 123' may non-uniformly operate. Accordingly, the amount of current of the inductor current Izvs flowing during the dead time DT is preferably uniform.

As an example, in FIG. 25, one freewheeling cell may include one period in which the output voltage VO has a ground level. FIG. 25 shows three powering cells and freewheeling cells. As another example, one freewheeling cell may include one period in which the output voltage VO has a high level and a low level, and one period in which the output voltage VO has a ground level. FIG. 25 may show three freewheeling cells.

Figure 26:
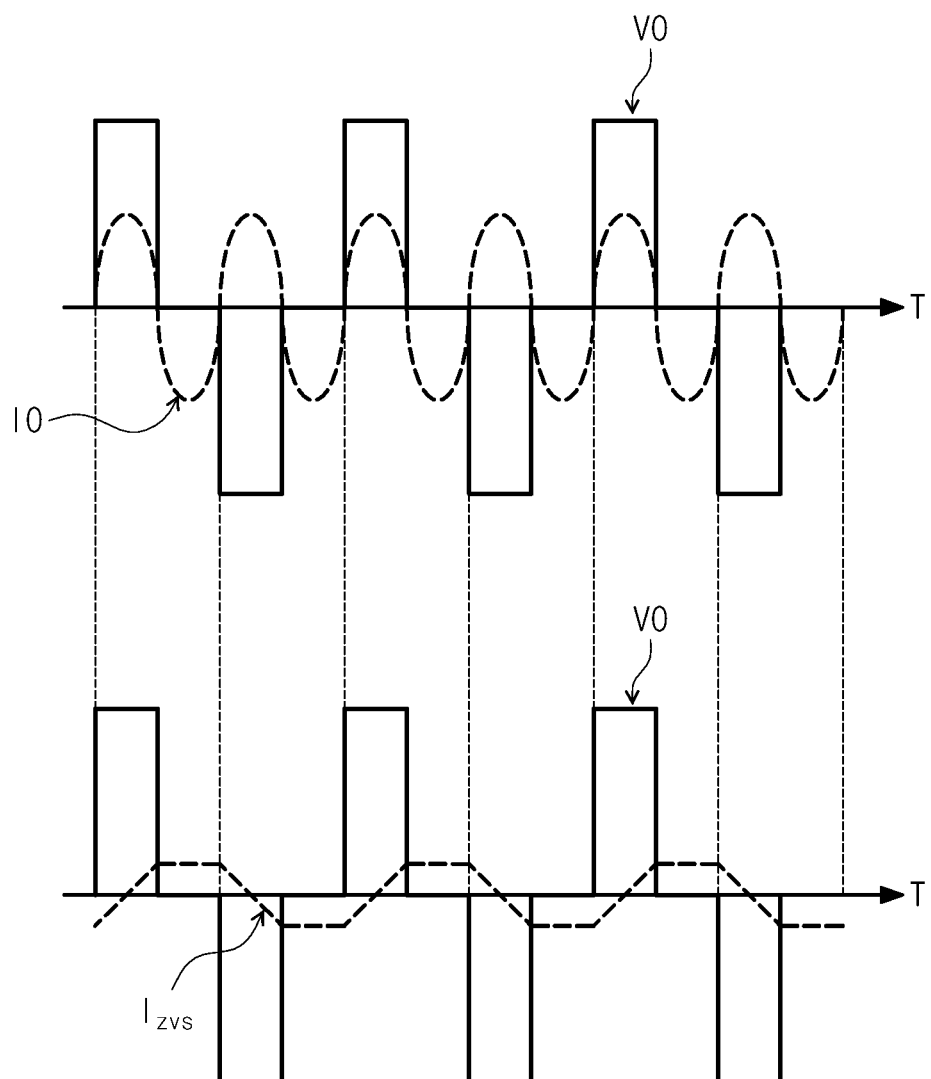
FIG. 26 illustrates another example of a variation in an inductor current when an output voltage has a freewheeling period.

FIG. 26 illustrates another example of a variation in an inductor current Izvs when an output voltage VO has a freewheeling period. Referring to FIGS. 1, 18, and 26, a powering period of a half-cycle and a freewheeling period of a half-cycle may be alternately arranged. In FIG. 26, a positive peak value and a negative peak value of the inductor current Izvs match each other.

However, when the output voltage VO has a negative value, the output current IO has a positive value. Power is supplied from the load 140 to the inverter 123 when the output voltage VO and the output current IO have phases opposite to each other, which may result in unnecessary power consumption and may cause the load 140 to be turned off. Accordingly, the phases of the output voltage VO and the output current IO preferably have the same sign.

As an example, in FIG. 26, a freewheeling cell may include a half-cycle in which the output voltage VO has a high level, a half-cycle in which the output voltage VO has a ground level, a half-cycle in which the output voltage VO has a low level, and a half-cycle in which in which the output voltage VO has a ground level. For example, FIG. 26 may show three freewheeling cells.

FIG. 27 illustrates another example of a variation in an inductor current Izvs when an output voltage VO has a freewheeling period. Referring to FIGS. 1, 18, and 27, a single freewheeling cell may have four cycles. Two freewheeling cells are shown in FIG. 27.

A freewheeling cell includes one cycle in which the output voltage VO has a high level and a low level, one cycle in which the output voltage VO is in a ground level, one cycle in which the output voltage VO is in a high level and a ground level, and one period in which the output voltage VO is in a ground level and a low level. A positive peak value and a negative peak value of the inductor current Izvs match each other. Additionally, a sign of the output voltage VO and a sign of an output current IO match each other.

As illustrated in FIG. 27, a controller 125 may control a frequency fsw of the output voltage VO such that the frequency fsw of the output voltage VO and a resonant frequency f0 of a load 140 match each other. Zero voltage nearly zero current switching (ZVZCS) may be achieved by inductors an inductor Lzvs. Also the controller 125 may control freewheeling cells such that a positive peak value and a positive peak value of the inductor current Izvs match each other. The controller 125 may control freewheeling cells such that the sign of the output voltage VO and the sign of the output current IO match each other.

Figure 28:
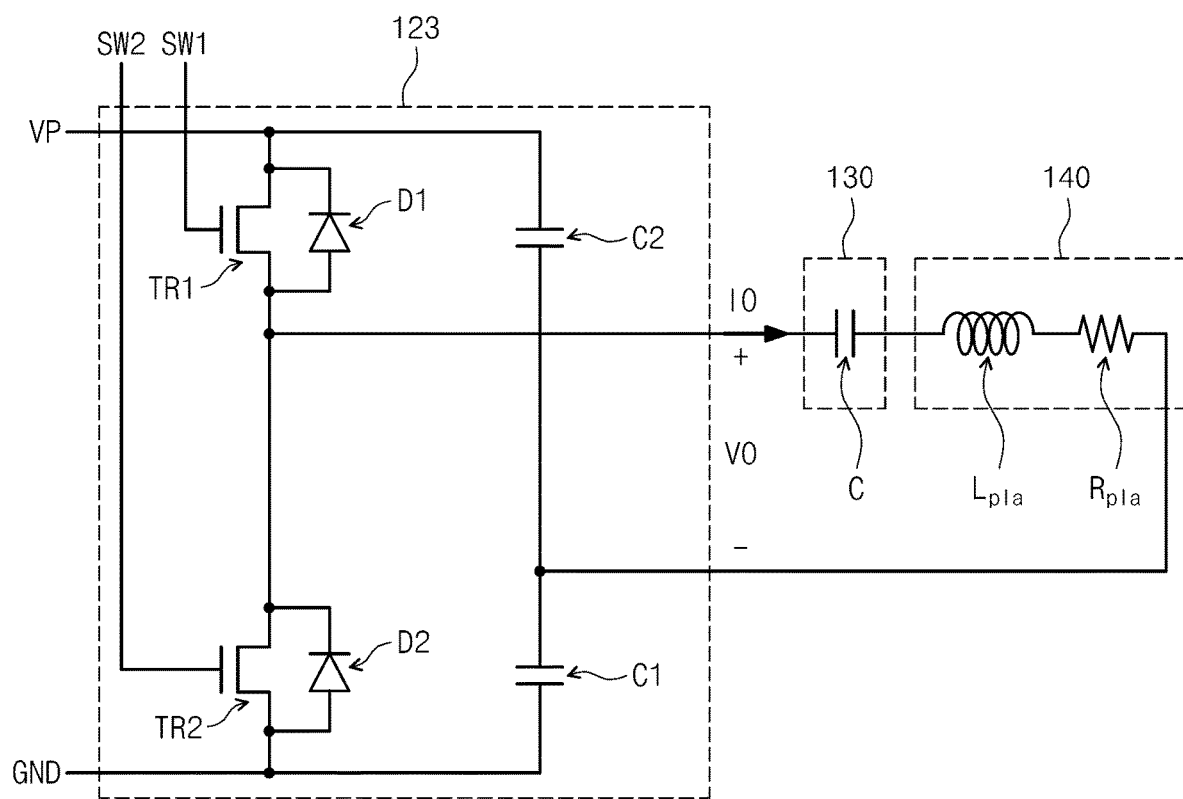
FIG. 28 is a block diagram of a power supply system including a half-bridge circuit according to another example embodiment of the present disclosure.

FIG. 28 is a block diagram of a power supply system including a half-bridge circuit according to another example embodiment of the present disclosure. Referring to FIGS. 1 and 28, an inverter 123' includes first and second transistors TR1 and TR2, first and second diodes D1 and D2, and first and second capacitors C1 and C2. An impedance matching circuit 130 includes a capacitor C, and a load 140 may be modeled as an inductor Lpla and a resistor Rpla.

As compared to the inverter 123 in FIG. 2, the inverter 123' in FIG. 28 includes the first capacitor C1 disposed instead of the third transistor TR3 and the third diode and the second capacitor C2 disposed instead of the fourth transistor TR4 and the fourth diode D4. Each of the first and second capacitors C1 and C2 has capacitance high enough to have a both-end voltage which is substantially a direct current (DC). The inverter 123' in FIG. 28 may be a half-bride type inverter having half an output voltage range and half a switch and half switching signals, as compared to the inverter 123 in FIG. 2.

The inverter 223 of the power supply 220 described with reference to FIG. 10 may include the inverter 123' shown in FIG. 18. As described with reference to FIG. 18, an inductor Lzvs may be applied to the inverter 123', similarly to the inverter 223'. The present inventive concept to adjust a powering period and a freewheeling period described with reference to FIG. 24 may be identically applied to the inverter 123' in FIG. 24. In addition, the method of controlling (supplying) power described with reference to FIGS. 26 and 27 may be identically applied to the inverter 123' in FIG. 28.

According to the present disclosure, a pattern of switching signals provided to an inverter of a power supply is adjusted to adjust the amount of power or current supplied to a load. Accordingly, a power supply and a method of supplying power, having improved performance and causing noise and stress without increasing complexity, are provided. In addition, a frequency of an output voltage is adjusted depending on a phase difference between the output voltage and an output current, and the phase difference is adjusted. Accordingly, a power supply and a method of supplying power, automatically compensating for the phase difference between the output voltage and the output current, are provided.

Although the present disclosure and its advantages have been described in detail, it should be understood that various changes, substitutions and alterations can be made herein without departing from the spirit and scope of the disclosure as defined by the following claims.

What is claimed is:

1. A voltage supply applying an AC voltage to a variable load, the voltage supply comprising:
an inverter applying an AC voltage to the variable load and having at least two switches electrically interposed between terminals which are connected to (i) the variable load and (ii) a DC power source,
wherein the AC voltage has a frequency determined by operation of the at least two switches; and
a controller generating a switching signal which controls the operation of the at least two switches,
wherein the controller is configured to:
transmit a first switching signal which controls at least one of the at least two switches such that a first AC voltage having a first frequency is applied to the variable load during a first time duration,
wherein the first frequency is higher than or equal to a resonant frequency of the variable load,
determine a second frequency of a second AC voltage to be applied to the variable load during a second time duration after the first time duration based on transition in a physical characteristic of the variable load,
transmit a second switching signal which controls at least one of the at least two switches such that the second AC voltage having the second frequency is applied to the variable load during the second time duration,
wherein the controller is further configured to:
detect an output current which is output from the inverter to the variable load used for determining whether the physical characteristic of the variable load is transitioned during the first time duration,
acquire, based on it being determined that the physical characteristic of the variable load was transitioned within the first time duration using the detected output current, a first phase information of the output current used for determining the second frequency of the second AC voltage to be applied to the variable load during the second time duration,
acquire a second phase information of an output voltage which is transmitted from the inverter to the variable load based on the first switching signal,
detect a first delay time between the output current and the output voltage using the first phase information and the second phase information,
acquire N first delay times by repeating N times the acquisition of the first phase information, the acquisition of the second phase information, and the detection of the first delay time,
calculate a first representative value of the N first delay times, wherein N is a positive integer greater than or equal to 2,
determine the second frequency to be same with the first frequency based on the first representative value being included in a preconfigured range, and
determine the second frequency higher or lower than the first frequency based on the first representative value being not included in the preconfigured range.

2. The voltage supply of claim 1, wherein the controller is further configured to:
acquire a third phase information of the first switching signal, and
acquire the second phase information of the output voltage using the third phase information.

3. The voltage supply of claim 1, wherein the controller is further configured to
acquire a fourth phase information of the output current used for determining a third frequency of a third AC voltage to be applied to the variable load during a third time duration after the second time duration,
acquire a fifth information of the output voltage based on the first switching signal,
detect a second delay time between the output current and the output voltage using the fourth phase information and the fifth phase information,
acquire N second delay times by repeating N times the acquisition of the fourth phase information, the acquisition of the fifth phase information, and the detection of the second delay time,
calculate a second representative value of the N second delay times,
determine the third frequency to be same with the second frequency based on the second representative value being included in the preconfigured range, and determine the third frequency higher or lower than the second frequency based on the second representative value being not included in the preconfigured range.

4. The voltage supply of claim 1, wherein the first representative value is an average value of the N first delay times.

5. The voltage supply of claim 1, wherein N is a predetermined value.

6. A method of applying an AC voltage to a variable load by a voltage supply, wherein the voltage supply comprises an inverter applying an AC voltage to the variable load and having at least two switches electrically interposed between terminals which are connected to (i) the variable load and (ii) a DC power source, the method comprising:
    transmitting a first switching signal which controls at least one of the at least two switches such that a first AC voltage having a first frequency is applied to the variable load during a first time duration,
    wherein the first frequency is higher than or equal to a resonant frequency of the variable load;
    determining a second frequency of a second AC voltage to be applied to the variable load during a second time duration after the first time duration based on transition in a physical characteristic of the variable load;
    transmitting a second switching signal which controls at least one of the at least two switches such that the second AC voltage having the second frequency is applied to the variable load during the second time duration;
    wherein the determining the second frequency comprising:
    detecting an output current which is output from the inverter to the variable load used for determining whether the physical characteristic of the variable load is transitioned during the first time duration;
    acquiring, based on it being determined that the physical characteristic of the variable load was transitioned within the first time duration using the detected output current, a first phase information of the output current used for determining the second frequency of the second AC voltage to be applied to the variable load during the second time duration;
    acquiring a second phase information of an output voltage which is transmitted from the inverter to the variable load based on the first switching signal;
    detecting a first delay time between the output current and the output voltage using the first phase information and the second phase information;
    acquiring N first delay times by repeating N times the acquisition of the first phase information, the acquisition of the second phase information, and the detection of the first delay time;
    calculating a first representative value of the N first delay times, wherein N is a positive integer greater than or equal to 2;
    determining the second frequency to be same with the first frequency based on the first representative value being included in a preconfigured range; and
    determining the second frequency higher or lower than the first frequency based on the first representative value being not included in the preconfigured range.

7. The method of claim 6, wherein the acquiring the second phase information comprising:
    acquiring a third phase information of the first switching signal; and
    acquiring the second phase information of the output voltage using the third phase information.

8. The method of claim 6, further comprising:
    acquiring a fourth phase information of the output current used for determining a third frequency of a third AC voltage to be applied to the variable load during a third time duration after the second time duration;
    acquiring a fifth information of the output voltage based on the first switching signal;
    detecting a second delay time between the output current and the output voltage using the fourth phase information and the fifth phase information;
    acquiring N second delay times by repeating N times the acquisition of the fourth phase information, the acquisition of the fifth phase information, and the detection of the second delay time;
    calculating a second representative value of the N second delay times;
    determining the third frequency to be same with the second frequency based on the second representative value being included in the preconfigured range; and
    determining the third frequency higher or lower than the second frequency based on the second representative value being not included in the preconfigured range.

9. The method of claim 6, wherein the first representative value is an average value of the N first delay times.

10. The method of claim 6, wherein N is a predetermined value.

* * * * *